US012696550B2

(12) United States Patent
Rehder

(10) Patent No.: US 12,696,550 B2
(45) Date of Patent: Jul. 28, 2026

(54) POWER ROUTING MODULE WITH A SWITCHING MATRIX FOR A SOLAR CELL ARRAY

(71) Applicant: The Boeing Company, Chicago, IL (US)

(72) Inventor: Eric Rehder, Los Angeles, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 15/643,285

(22) Filed: Jul. 6, 2017

(65) Prior Publication Data

US 2018/0076761 A1    Mar. 15, 2018

Related U.S. Application Data

(63) Continuation-in-part of application No. 15/643,274, filed on Jul. 6, 2017, and a continuation-in-part of (Continued)

(51) Int. Cl.
*H01L 31/00* (2006.01)
*H02S 40/34* (2014.01)

(Continued)

(52) U.S. Cl.
CPC ............. *H10F 19/00* (2025.01); *H02S 40/34* (2014.12); *H10F 10/142* (2025.01); *H10F 19/50* (2025.01);

(Continued)

(58) Field of Classification Search
CPC ........... H01L 31/0504; H01L 31/02008; H01L 31/042; H01L 31/044; H01L 31/0443;

(Continued)

(56) References Cited

U.S. PATENT DOCUMENTS

| | | | |
|---|---|---|---|
| 3,376,164 A | 4/1968 | Bachwansky | |
| 3,833,426 A | 9/1974 | Mesch | |

(Continued)

FOREIGN PATENT DOCUMENTS

| | | |
|---|---|---|
| CN | 103155158 A | 6/2013 |
| CN | 203277428 U | 11/2013 |

(Continued)

OTHER PUBLICATIONS

Non-Final Office Action dated Feb. 1, 2021 for U.S. Appl. No. 15/643,277.

(Continued)

*Primary Examiner* — Thanh Truc Trinh
(74) *Attorney, Agent, or Firm* — MH2 Technology Law Group LLP

(57) ABSTRACT

A power routing module with a switching matrix for electrically interconnecting a plurality of solar cells in an array, wherein the switching matrix is configured to dynamically route power among a plurality of current pathways connected between the power routing module and the plurality of solar cells. At least one of the solar cells has at least one cropped corner resulting in a corner region, an area of a substrate in the corner region remains exposed when the solar cells are attached to the substrate, and the power routing module with the switching matrix is attached to the substrate in the area of the substrate in the corner region that remains exposed.

30 Claims, 25 Drawing Sheets

Related U.S. Application Data application No. 15/643,277, filed on Jul. 6, 2017, and a continuation-in-part of application No. 15/643,279, filed on Jul. 6, 2017, and a continuation-in-part of application No. 15/643,282, filed on Jul. 6, 2017, and a continuation-in-part of application No. 15/643,287, filed on Jul. 6, 2017, now Pat. No. 10,763,383, and a continuation-in-part of application No. 15/643,289, filed on Jul. 6, 2017, now Pat. No. 11,437,533.

(60) Provisional application No. 62/394,666, filed on Sep. 14, 2016, provisional application No. 62/394,636, filed on Sep. 14, 2016, provisional application No. 62/394,616, filed on Sep. 14, 2016, provisional application No. 62/394,623, filed on Sep. 14, 2016, provisional application No. 62/394,627, filed on Sep. 14, 2016, provisional application No. 62/394,629, filed on Sep. 14, 2016, provisional application No. 62/394,632, filed on Sep. 14, 2016, provisional application No. 62/394,649, filed on Sep. 14, 2016, provisional application No. 62/394,667, filed on Sep. 14, 2016, provisional application No. 62/394,671, filed on Sep. 14, 2016, provisional application No. 62/394,641, filed on Sep. 14, 2016, provisional application No. 62/394,672, filed on Sep. 14, 2016.

(51) Int. Cl.

| | |
|---|---|
| *H10F 10/142* | (2025.01) |
| *H10F 19/00* | (2025.01) |
| *H10F 19/50* | (2025.01) |
| *H10F 19/70* | (2025.01) |
| *H10F 19/75* | (2025.01) |
| *H10F 19/80* | (2025.01) |
| *H10F 19/90* | (2025.01) |
| *H10F 77/00* | (2025.01) |
| *H10F 77/14* | (2025.01) |
| *H10F 77/169* | (2025.01) |
| *H10F 77/20* | (2025.01) |
| *H10P 14/20* | (2026.01) |

(52) U.S. Cl.
CPC ............. *H10F 19/70* (2025.01); *H10F 19/75* (2025.01); *H10F 19/80* (2025.01); *H10F 19/90* (2025.01); *H10F 19/902* (2025.01); *H10F 19/904* (2025.01); *H10F 19/908* (2025.01); *H10F 77/00* (2025.01); *H10F 77/147* (2025.01); *H10F 77/148* (2025.01); *H10F 77/169* (2025.01); *H10F 77/211* (2025.01); *H10F 77/935* (2025.01); *H10F 77/955* (2025.01); *H10P 14/3202* (2026.01); *Y02E 10/544* (2013.01)

(58) Field of Classification Search
CPC ............... H01L 31/02; H01L 31/02021; H01L 31/022425; H01L 31/035281; H01L 31/03529; H01L 31/0392; H01L 31/05; H01L 31/0508; H01L 31/0516; H01L 31/0687; H01L 21/02439; H01L 27/142; H02S 40/32; H02S 40/34; Y02E 10/544
See application file for complete search history.

(56) References Cited

U.S. PATENT DOCUMENTS

| | | | |
|---|---|---|---|
| 4,057,439 A | 11/1977 | Lindmayer | |
| 4,257,821 A | 3/1981 | Kelly et al. | |
| 4,481,378 A | 11/1984 | Lesk | |
| 4,755,231 A | 7/1988 | Kurland et al. | |
| 5,330,583 A | 7/1994 | Asai et al. | |
| 5,391,235 A | 2/1995 | Inoue | |
| 5,567,248 A | 10/1996 | Chung | |
| 5,701,067 A | 12/1997 | Kaji et al. | |
| 5,855,692 A | 1/1999 | Kaji et al. | |
| 6,008,448 A | 12/1999 | Peck | |
| 6,034,322 A | 3/2000 | Pollard | |
| 6,156,967 A | 12/2000 | Ralph et al. | |
| 6,313,396 B1* | 11/2001 | Glenn ................... | H01L 31/042 |
| | | | 136/251 |
| 6,350,944 B1 | 2/2002 | Sherif et al. | |
| 6,441,297 B1 | 8/2002 | Keller et al. | |
| 6,543,725 B1 | 4/2003 | Meurer et al. | |
| 6,555,739 B2 | 4/2003 | Kawam | |
| 6,563,289 B1 | 5/2003 | Cross | |
| 6,637,702 B1 | 10/2003 | McCandless | |
| 8,604,330 B1 | 12/2013 | Hennessy et al. | |
| 8,814,099 B1 | 8/2014 | Harvey et al. | |
| 9,120,583 B1 | 9/2015 | Spence et al. | |
| 9,758,261 B1 | 9/2017 | Steinfeldt | |
| 2003/0057533 A1 | 3/2003 | Lemmi et al. | |
| 2004/0118446 A1* | 6/2004 | Toyomura ............... | H02S 40/32 |
| | | | 136/244 |
| 2005/0133079 A1 | 6/2005 | Boulanger et al. | |
| 2006/0170435 A1 | 8/2006 | Granicher et al. | |
| 2007/0005843 A1 | 1/2007 | Sim et al. | |
| 2007/0152194 A1 | 7/2007 | Natekar et al. | |
| 2008/0142071 A1 | 6/2008 | Dorn et al. | |
| 2008/0245405 A1 | 10/2008 | Garvison et al. | |
| 2008/0295889 A1 | 12/2008 | Schindler et al. | |
| 2009/0183760 A1 | 7/2009 | Meyer | |
| 2009/0255571 A1 | 10/2009 | Xia et al. | |
| 2009/0272436 A1 | 11/2009 | Cheung | |
| 2009/0288702 A1 | 11/2009 | Kim et al. | |
| 2010/0012172 A1 | 1/2010 | Meakin et al. | |
| 2010/0089435 A1 | 4/2010 | Lockenhoff | |
| 2010/0126560 A1 | 5/2010 | Lauvray et al. | |
| 2010/0186795 A1 | 7/2010 | Gaul | |
| 2010/0212741 A1 | 8/2010 | Lin | |
| 2010/0295383 A1 | 11/2010 | Cummings | |
| 2010/0313954 A1 | 12/2010 | Seel | |
| 2011/0041890 A1 | 2/2011 | Sheats | |
| 2011/0073163 A1 | 3/2011 | Cheung | |
| 2011/0079263 A1 | 4/2011 | Avrutsky | |
| 2011/0120752 A1 | 5/2011 | Imai et al. | |
| 2011/0138609 A1 | 6/2011 | Chereukupalli | |
| 2011/0168238 A1 | 7/2011 | Metin et al. | |
| 2011/0198444 A1 | 8/2011 | Dong | |
| 2012/0103388 A1 | 5/2012 | Meakin et al. | |
| 2012/0125391 A1 | 5/2012 | Pinarbasi et al. | |
| 2012/0161801 A1 | 6/2012 | Hasegawa | |
| 2012/0167954 A1 | 7/2012 | Meakin et al. | |
| 2012/0199176 A1 | 8/2012 | Hong et al. | |
| 2012/0313455 A1 | 12/2012 | Latham | |
| 2013/0014802 A1 | 1/2013 | Zimmerman | |
| 2013/0056047 A1 | 3/2013 | Beck et al. | |
| 2013/0263915 A1 | 10/2013 | Snidow | |
| 2014/0000682 A1* | 1/2014 | Zhao ................... | H01L 31/0481 |
| | | | 136/251 |
| 2014/0033625 A1 | 2/2014 | Jenkins et al. | |
| 2014/0083497 A1 | 3/2014 | Ehrenpfordt et al. | |
| 2014/0166067 A1* | 6/2014 | McGlynn .......... | H01L 31/06875 |
| | | | 136/244 |
| 2014/0255780 A1 | 9/2014 | Mikhaylik et al. | |
| 2014/0366927 A1* | 12/2014 | Lavrova ................. | H02J 17/00 |
| | | | 136/244 |
| 2015/0083191 A1 | 3/2015 | Gmundner | |
| 2015/0096607 A1 | 4/2015 | Yong | |
| 2015/0144173 A1 | 5/2015 | Hoang et al. | |
| 2015/0287862 A1 | 10/2015 | Pardell Vilella | |
| 2015/0318420 A1 | 11/2015 | Sewell et al. | |
| 2015/0349703 A1 | 12/2015 | Morad et al. | |
| 2016/0112004 A1 | 4/2016 | Thiel et al. | |
| 2016/0126380 A1 | 5/2016 | Chang | |
| 2016/0197207 A1 | 7/2016 | Morioka et al. | |
| 2016/0218665 A1* | 7/2016 | Crist ................... | H01L 31/0504 |
| 2016/0380221 A1 | 12/2016 | Gotanda et al. | |
| 2017/0018670 A1 | 1/2017 | Bende et al. | |

(56) References Cited

U.S. PATENT DOCUMENTS

| | | | |
|---|---|---|---|
| 2017/0040933 A1 | 2/2017 | Vogel | |
| 2017/0054406 A1* | 2/2017 | Narla | H02S 10/00 |
| 2017/0098736 A1 | 4/2017 | Lee et al. | |
| 2017/0163212 A1 | 6/2017 | France et al. | |
| 2017/0229692 A1 | 8/2017 | Thiel et al. | |
| 2017/0374737 A1 | 12/2017 | Jeong et al. | |
| 2019/0127089 A1 | 5/2019 | Tomoda et al. | |
| 2019/0140584 A1 | 5/2019 | Hayashi et al. | |

FOREIGN PATENT DOCUMENTS

| | | | |
|---|---|---|---|
| CN | 104241406 A | 12/2014 | |
| CN | 104443439 | 3/2015 | |
| CN | 104443439 A | 3/2015 | |
| DE | 1013644 | 2/2003 | |
| DE | 10136442 | 2/2003 | |
| DE | 10136442 A1 | 2/2003 | |
| EP | 1160876 | 12/2001 | |
| EP | 1548847 | 6/2005 | |
| EP | 2833416 | 2/2015 | |
| EP | 2981156 | 2/2016 | |
| EP | 3297042 | 3/2018 | |
| JP | 2002190612 A | 7/2002 | |
| JP | 2010219349 A | 9/2010 | |
| JP | 2011071214 A | 4/2011 | |
| JP | 2012204651 A | 10/2012 | |
| WO | 2009/012567 | 1/2009 | |

OTHER PUBLICATIONS

Final Office Action dated Jul. 9, 2019 for U.S. Appl. No. 15/787,304.

Non-Final Office Action dated Jul. 30, 2018 for U.S. Appl. No. 15/643,277.

Extended European Search Report dated Dec. 8, 2017for EP application No. 17191159.7.

Final Office Action dated Apr. 15, 2020 for U.S. Appl. No. 15/938,791.

Non-Final Office Action dated Jul. 23, 2019 for U.S. Appl. No. 15/643,279.

Final Office Action dated Feb. 6, 2020 for U.S. Appl. No. 15/643,287.

Non-Final Office Action dated Dec. 7, 2020 for U.S. Appl. No. 15/787,304.

1 Final Office Action dated Feb. 6, 2020 for U.S. Appl. No. 15/643,279.

Non-Final Office Action dated Apr. 23, 2018 for U.S. Appl. No. 15/623,489.

Final Office Action dated Jul. 28, 2020 for U.S. Appl. No. 115/643,277.

Extended European Search Report dated Nov. 8, 2018 for EP Application No. 18176224.6.

Final Office Action dated Mar. 5, 2021 for U.S. Appl. No. 15/643,279.

Final Office Action dated Jul. 10, 2020 for U.S. Appl. No. 15/938,787.

European Search Report dated Dec. 19, 2017 for EP application No. 17191162.1.

Final Office Action dated Jun. 6, 2019 for U.S. Appl. No. 15/643,282.

Final Office Action dated Apr. 10, 2020 for U.S. Appl. No. 15/643,282.

Non-Final Office Action dated Jan. 28, 2019 for U.S. Appl. No. 15/643,289.

Extended European Search Report dated Nov. 12, 2018 for EP Application No. 18176222.0.

Final Office Action dated May 19, 2020 for U.S. Appl. No. 15/787,304.

Extended European Search Report dated Jul. 8, 2019 for European Patent Application No. 19162438.6.

European Search Report dated Dec. 19, 2017 for EP application No. 17191168.8.

Non-Final Office Action dated Nov. 22, 2019 for U.S. Appl. No. 15/938,791.

Final Office Action dated Jul. 17, 2019 for U.S. Appl. No. 15/6787,291.

Notice of Allowance dated Apr. 23, 2020 for U.S. Appl. No. 15/643,287.

Non-Final Office Action dated Jan. 8, 2020 for U.S. Appl. No. 15/787,304.

Extended European Search Report dated Dec. 7, 2017 for EP application No. 17191154.8.

Final Office Action dated Oct. 1, 2020 for U.S. Appl. No. 15/643,289.

Non-Final Office Action dated Sep. 27, 2019 for U.S. Appl. No. 15/643,287.

Non-Final Office Action dated Mar. 24, 2020 for U.S. Appl. No. 15/643,277.

Non-Final Office Action dated Jan. 3, 2020 for U.S. Appl. No. 15/938,787.

Non-Final Office Action dated Jul. 28, 2020 for U.S. Appl. No. 15/643,279.

Non-Final Office Action dated Feb. 8, 2019 for Utility U.S. Appl. No. 15/643,274.

European Search Report dated Dec. 21, 2017 for EP application No. 17191166.2.

Baumli et al., "Solder Materials With Micro and Nanoparticles: a Review", Materials Science and Engineering, Jan. 1, 2015, pp. 42-49.

Non-Final Office Action dated Feb. 5, 2019 for Utility U.S. Appl. No. 15/643,282.

Final Office Action dated Jun. 15, 2020 for U.S. Appl. No. 15/787,291.

Non-Final Office Action dated Nov. 9, 2020 for U.S. Appl. No. 15/643,282.

Non-Final Office Action dated Dec. 9, 2019 for U.S. Appl. No. 15/643,282.

Non-Final Office Action dated Jan. 7, 2021 for U.S. Appl. No. 15/787,291.

Non-Final Office Action dated Mar. 19, 2020 for U.S. Appl. No. 15/643,289.

Non-Final Office Action dated Mar. 31, 2020 for U.S. Appl. No. 15/643,274.

Non-Final Office Action dated Oct. 5, 2018 for U.S. Appl. No. 15/643,279.

Non-Final Office Action dated Mar. 14, 2019 for U.S. Appl. No. 15/787,304.

Final Office Action dated Aug. 28, 2018 for U.S. Appl. No. 15/643,289.

Final Office Action dated Jan. 15, 2019 for Utility U.S. Appl. No. 15/643,277.

Final Office Action dated Apr. 10, 2019 for U.S. Appl. No. 15/643,279.

Stern, T., et al., "Modular Solar Panels Using Components Engineered for Producibility", Photovoltaic Specialists Conference (PVSC), 2011 37th IEEE, Jun. 19-24, 2011, pp. 001626-001629.

Walmsley, N., et al., "Increasing the TRL Level of New PV Technologies Using Modular Solar Panels", Photovoltaic Specialists Conference (PVSC), 2012 38th IEEE, Jun. 3-8, 2012, pp. 002835-002839.

European Communication dated Feb. 19, 2020 for EP Application No. 18176224.6.

Non-Final Office Action dated Feb. 18, 2021 for U.S. Appl. No. 15/938,791.

Final Office Action dated Mar. 12, 2021 for U.S. Appl. No. 15/643,282.

Non-Final Office Action dated Mar. 14, 2019 for U.S. Appl. No. 15/787,291.

European Examination Communication dated Dec. 1, 2020 for EP Application No. 17191162.1.

European Search Report dated Dec. 4, 2017 for EP application No. 17191134.

Non-Final Office Action dated Feb. 4, 2020 for U.S. Appl. No. 15/787,291.

Final Office Action dated Oct. 10, 2019 for U.S. Appl. No. 15/643,277.

Final Office Action dated Aug. 6, 2019 for U.S. Appl. No. 15/643,289.

Final Office Action dated Aug. 22, 2019 for U.S. Appl. No. 15/643,274.

Japanese Notice of Reasons for Rejection dated Oct. 5, 2021 for Japanese Application No. 2017-176669.

Non-Final Office Action dated May 12, 2021 for U.S. Appl. No. 15/643,274.

Non-Final Office Action dated Aug. 18, 2021 for U.S. Appl. No. 15/787,291.

(56) References Cited

OTHER PUBLICATIONS

Non-Final Office Action dated Aug. 18, 2021 for U.S. Appl. No. 15/787,304.

Non-Final Office Action dated Sep. 29, 2021 for U.S. Appl. No. 15/643,289.

Non-Final Office Action dated Aug. 2, 2021 for U.S. Appl. No. 15/643,282.

Final Office Action dated Aug. 13, 2021 for U.S. Appl. No. 15/938,791.

Final Office Action dated Jun. 1, 2021 for U.S. Appl. No. 15/643,277.

Final Office Action dated Apr. 22, 2021 for U.S. Appl. No. 15/787,291.

Non-Final Office Action dated Sep. 17, 2021 for U.S. Appl. No. 15/643,277.

Non-Final Office Action dated Apr. 27, 2021 for U.S. Appl. No. 15/938,787.

Final Office Action dated Feb. 24, 2022 for U.S. Appl. No. 15/643,277.

Notice of Allowance dated Jun. 23, 2022 for U.S. Appl. No. 16/847,359.

Final Office Action dated Feb. 11, 2022 for U.S. Appl. No. 16/847,032.

Final Office Action dated Dec. 15, 2021 for U.S. Appl. No. 15/787,304.

Final Office Action dated Feb. 14, 2022 for U.S. Appl. No. 16/847,359.

Final Office Action dated Dec. 17, 2021 for U.S. Appl. No. 15/787,291.

Non-Final Office Action dated Jul. 1, 2022 for U.S. Appl. No. 15/643,277.

Final Office Action dated Dec. 28, 2021 for U.S. Appl. No. 15/643,282.

Final Office Action dated Jun. 3, 2022 for U.S. Appl. No. 15/643,279.

Japanese Decision of Rejection (with English translation) dated May 24, 2022 for Japanese Patent Application No. 2017-176669.

Final Office Action dated Dec. 9, 2021 for U.S. Appl. No. 15/938,787.

Notice of Allowance dated Apr. 20, 2022 for U.S. Appl. No. 15/643,289.

Non-Final Office Action dated Mar. 14, 2022 for U.S. Appl. No. 15/643,282.

Non-Final Office Action dated Dec. 6, 2021 for U.S. Appl. No. 15/643,279.

Non-Final Office Action dated Dec. 22, 2022 for U.S. Appl. No. 15/938,787.

Non-Final Office Action dated Sep. 21, 2022 for U.S. Appl. No. 17/100,823.

Non-Final Office Action dated Sep. 15, 2022 for U.S. Appl. No. 16/543,279.

Final Office Action dated Feb. 6, 2023 for U.S. Appl. No. 17/100,823.

Non-Final Office Action dated Dec. 23, 2022 for U.S. Appl. No. 17/878,348.

Final Office Action dated Aug. 25, 2022 for U.S. Appl. No. 15/643,282.

Non-Final Office Action dated Sep. 23, 2022 for U.S. Appl. No. 16/991,589.

Non-Final Office Action dated Dec. 20, 2022 for U.S. Appl. No. 15/643,282.

Final Office Action dated Dec. 1, 2022 for U.S. Appl. No. 15/643,277.

Notice of Allowance dated Jan. 24, 2024 for U.S. Appl. No. 16/847,032.

Final Office Action dated Apr. 24, 2024 for U.S. Appl. No. 15/643,274.

Non-Final Office Action dated Apr. 19, 2023 for U.S. Appl. No. 15/787,304.

Final Office Action dated Apr. 18, 2023 for U.S. Appl. No. 16/991,589.

Final Office Action dated Jun. 27, 2023 for U.S. Appl. No. 15/643,282.

Final Office Action dated Jan. 9, 2024 for U.S. Appl. No. 17/100,823.

Non-Final Office Action dated May 5, 2023 for U.S. Appl. No. 15/797,291.

Final Office Action dated Mar. 4, 2024 for U.S. Appl. No. 15/643,279.

Non-Final Office Action dated Sep. 13, 2023 for U.S. Appl. No. 15/643,279.

Final Office Action dated Oct. 10, 2023 for U.S. Appl. No. 15/938,791.

Final Office Action dated May 23, 2024 for U.S. Appl. No. 15/643,282.

Final Office Action dated May 24, 2024 for U.S. Appl. No. 15/787,291.

Non-Final Office Action dated May 11, 2023 for U.S. Appl. No. 15/643,277.

Final office Action dated Jul. 7, 2023 for U.S. Appl. No. 17/878,348.

Non-Final Office Action dated Jun. 18, 2024 for U.S. Appl. No. 15/643,279.

Non-Final Office Action dated Sep. 20, 2023 for U.S. Appl. No. 16/991,589.

Final Office Action dated Nov. 15, 2023 for U.S. Appl. No. 15/643,277.

Non-Final Office Action dated May 7, 2024 for U.S. Appl. No. 17/100,823.

Non-Final Office Action dated Jan. 26, 2024 for U.S. Appl. No. 15/787,304.

Final Office Action dated Mar. 31, 2023 for U.S. Appl. No. 15/643,279.

Final Office Action dated May 10, 2024 for U.S. Appl. No. 15/787,304.

Non-Final Office Action dated May 14, 2024 for U.S. Appl. No. 15/643,277.

Non-Final Office Action dated Aug. 4, 2023 for U.S. Appl. No. 17/100,823.

Final Office Action dated Jun. 22, 2023 for U.S. Appl. No. 15/938,787.

Non-Final Office Action dated Nov. 9, 2023 for U.S. Appl. No. 15/643,282.

Final Office Action dated Mar. 14, 2024 for U.S. Appl. No. 16/991,589.

Non-Final Office Action dated Oct. 25, 2023 for U.S. Appl. No. 15/643,274.

Non-Final Office Action dated Oct. 26, 2023 for U.S. Appl. No. 17/878,348.

Non-Final Office Action dated Dec. 27, 2023 for U.S. Appl. No. 15/787,291.

Japanese Notice of Reasons for Refusal (with English translation) dated Nov. 14, 2023 for Japanese Patent Application No. 2022-151999.

Non-Final Office Action dated Sep. 25, 2023 for U.S. Appl. No. 16/847,032.

Non-Final Office Action dated Feb. 8, 2024 for U.S. Appl. No. 15/938,791.

Final Office Action dated Sep. 11, 2023 for U.S. Appl. No. 15/787,291.

Final Office Action dated Sep. 2, 2020 for U.S. Appl. No. 15/643,274.

* cited by examiner

POWER ROUTING MODULE WITH A SWITCHING MATRIX FOR A SOLAR CELL ARRAY

CROSS REFERENCE TO RELATED APPLICATIONS

This application claims the benefit under 35 U.S.C. Section 119(e) of the following co-pending and commonly-assigned applications:

U.S. Provisional Application Ser. No. 62/394,636, filed on Sep. 14, 2016, by Eric Rehder, entitled "SOLAR CELL ARRAY CONNECTIONS;"

U.S. Provisional Application Ser. No. 62/394,616, filed on Sep. 14, 2016, by Eric Rehder, entitled "CORNER CONNECTORS FOR A SOLAR CELL ARRAY;"

U.S. Provisional Application Ser. No. 62/394,623, filed on Sep. 14, 2016, by Eric Rehder, entitled "PREFABRI-CATED CONDUCTORS ON A SUBSTRATE TO FACILITATE CORNER CONNECTIONS FOR A SOLAR CELL ARRAY;";

U.S. Provisional Application Ser. No. 62/394,627, filed on Sep. 14, 2016, by Eric Rehder, entitled "SELECT CURRENT PATHWAYS IN A SOLAR ARRAY;"

U.S. Provisional Application Ser. No. 62/394,629, filed on Sep. 14, 2016, by Eric Rehder, entitled "MULTI-LAYER CONDUCTORS IN A SOLAR ARRAY;"

U.S. Provisional Application Ser. No. 62/394,632, filed on Sep. 14, 2016, by Eric Rehder, entitled "REWORK AND REPAIR OF COMPONENTS IN A SOLAR ARRAY;"

U.S. Provisional Application Ser. No. 62/394,649, filed on Sep. 14, 2016, by Eric Rehder, entitled "POWER ROUTING MODULE FOR A SOLAR ARRAY;"

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY;"

U.S. Provisional Application Ser. No. 62/394,667, filed on Sep. 14, 2016, by Eric Rehder, entitled "NANO-METAL CONNECTIONS FOR A SOLAR CELL ARRAY;"

U.S. Provisional Application Ser. No. 62/394,671, filed on Sep. 14, 2016, by Eric Rehder, entitled "BACK CON-TACTS FOR A SOLAR CELL ARRAY;"

U.S. Utility application Ser. No. 15/643,274, filed on Jul. 6, 2017, by Eric Rehder, entitled "SOLAR CELL ARRAY CONNECTIONS USING CORNER CON-DUCTORS;"

U.S. Utility application Ser. No. 15/643,277, filed on Jul. 6, 2017, by Eric Rehder, entitled "PREFABRICATED CONDUCTORS ON A SUBSTRATE TO FACILI-TATE CORNER CONNECTIONS FOR A SOLAR CELL ARRAY;"

U.S. Utility application Ser. No. 15/643,279, filed same date herewith Jul. 6, 2017, by Eric Rehder, entitled "REWORK AND REPAIR OF COMPONENTS IN A SOLAR ARRAY;"

U.S. Utility application Ser. No. 15/643,282, filed on Jul. 6, 2017, by Eric Rehder, entitled "POWER ROUTING MODULE FOR A SOLAR ARRAY;"

U.S. Utility application Ser. No. 15/643,287, filed on Jul. 6, 2017, by Eric Rehder, entitled "NANO-METAL CONNECTIONS FOR A SOLAR CELL ARRAY;" and U.S. Utility application Ser. No. 15/643,289, filed on same date herewith Jul. 6, 2017, by Eric Rehder, Philip Chiu, Tom Crocker, Daniel Law and Dale Waterman, entitled "SOLAR CELLS FOR A SOLAR CELL ARRAY;"

all of which applications claim the benefit under 35 U.S.C. Section 119 (e) of the co-pending and commonly-assigned provisional applications listed above: 62/394,636; 62/394,616; 62/394,623; 62/394,627; 62/394,629; 62/394,632; 62/394,649; 62/394,666; 62/394,667; 62/394,671; 62/394,641; and 62/394,672; and all of which applications are incorporated by reference herein.

BACKGROUND INFORMATION

1. Field

The disclosure is related generally to solar cell panels and, more specifically, to a power routing module with a switching matrix for a solar cell array.

2. Background

Typical spaceflight-capable solar cell panel assembly involves building long strings of solar cells. These strings are variable in length and can be very long, for example, up to and greater than 20 cells. Assembling such long, variable, and fragile materials is difficult, which has prevented auto-mation of the assembly.

Existing solutions use solar cells assembled into CIC (cell, interconnect and coverglass) units. The CIC has metal foil interconnects connected to the front of the cell that extend in parallel from one side of the CIC. The CICs are located close to each other and the interconnects make connection to the bottom of an adjacent cell. Using these interconnects, the CICs are assembled into linear strings. These linear strings are built-up manually and then laid out to form a large solar cell array comprised of many strings of variable length.

Additionally, a bypass diode is used to protect the cells from reverse bias, when the cells become partially shad-owed. The bypass diode generally connects the back con-tacts of two adjacent cells within the solar cell array.

When used in a satellite, the solar cell array is typically packaged as a panel. The dimensions of the panel are dictated by the needs of the satellite, including such con-straints as needed power, as well as the size and shape necessary to pack and store the satellite in a launch vehicle. Furthermore, the deployment of the panel often requires that some portions of the panel are used for the mechanical fixtures and the solar cell array must avoid these locations. In practice, the panel is generally rectangular, but its dimen-sions and aspect ratio vary greatly. The layout of the CICs and strings to fill this space must be highly customized for maximum power generation, which results in a fabrication process that is highly manual.

What is needed, then, is a means for promoting automated manufacturing of solar arrays, while preserving the ability for customization of solar cell arrays.

SUMMARY

The devices and methods of the present disclosure are embodied in many ways, including, but not limited to, the following examples listed below.

1. A power routing module with a switching matrix for electrically interconnecting a plurality of solar cells in an array, wherein the switching matrix is configured to dynamically route power among a plurality of current pathways connected between the power routing module and the plurality of solar cells. At least one of the solar cells has at least one cropped corner resulting in a corner region, an area of a substrate in the corner region remains exposed when the solar cells are attached to the substrate, and the power routing module with the switching matrix is attached to the substrate in the area of the substrate in the corner region that remains exposed.

2. The switching matrix is configured to dynamically route power among a plurality of current pathways connected between the power routing module and one or more bypass diodes.

3. The switching matrix is configured to dynamically route power among a plurality of current pathways connected between the power routing module and one or more power or bridging lines.

4. The switching matrix is configured to dynamically route power in response to a control signal.

5. The control signal is a wireless control signal from a remote source.

6. The switching matrix is a space division circuit switch, in which the current on a selected input path is connected to a selected output path.

7. The switching matrix is comprised of one or more connection blocks, each of which connects the selected input path to the selected output path according to a control signal.

8. The switching matrix is uniquely addressed or as a group.

9. Each connection block within the switching matrix is uniquely addressed.

10. Selected input and output paths within each connection block are uniquely addressed.

DRAWINGS

Referring now to the drawings in which like reference numbers represent corresponding parts throughout:

Figure 24:
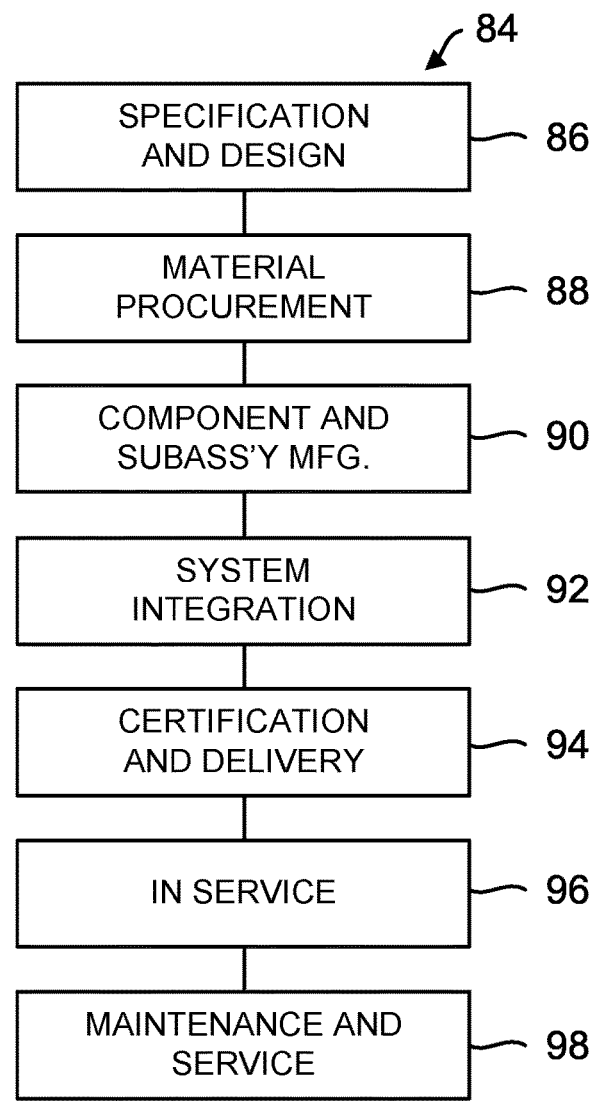

FIG. 24 describes a method of fabricating a solar cell, solar cell panel and/or satellite, according to one example.

Figure 25:
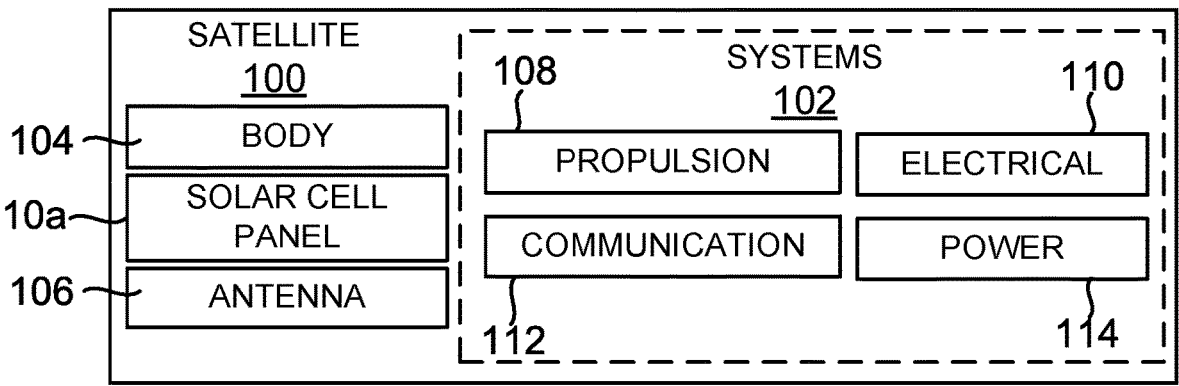

FIG. 25 illustrates a resulting satellite having a solar cell panel comprised of solar cells, according to one example.

Figure 26:
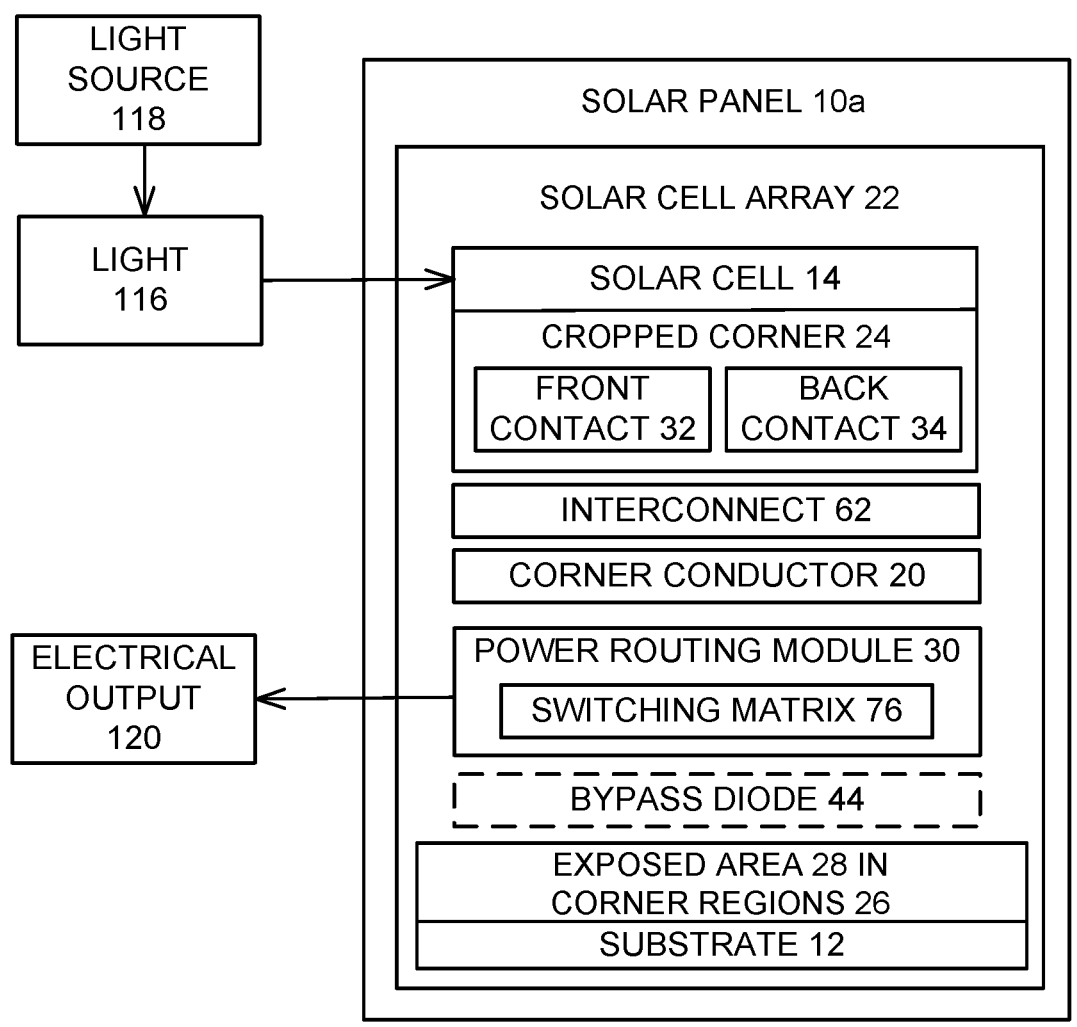

FIG. 26 is an illustration of the solar cell panel in the form of a functional block diagram, according to one example.

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

General Description

A new approach to the design of solar cell arrays, such as those used for spaceflight power applications, is based on electrical connections among the solar cells in the array.

This new approach rearranges the components of a solar cell and the arrangements of the solar cells in the array. Instead of having solar cells connected into long linear strings and then assembled onto a substrate, the solar cells are attached individually to a substrate, such that corner regions of adjacent cells are aligned on the substrate, thereby exposing an area of the substrate. Electrical connections between cells are made by corner conductors formed on or in the substrate in these corner regions. Consequently, this approach presents a solar cell array design based on individual cells.

Thus, a single laydown process and layout can be used in the fabrication of solar cell arrays. Current flow between solar cells will be assisted with conductors embedded in the substrate. These electrical connections define the specific characteristics of the solar cell array, such as its dimensions, stayout zones, and circuit terminations. This approach simplifies manufacturing, enables automation, and reduces costs and delivery times.

Figure 1:
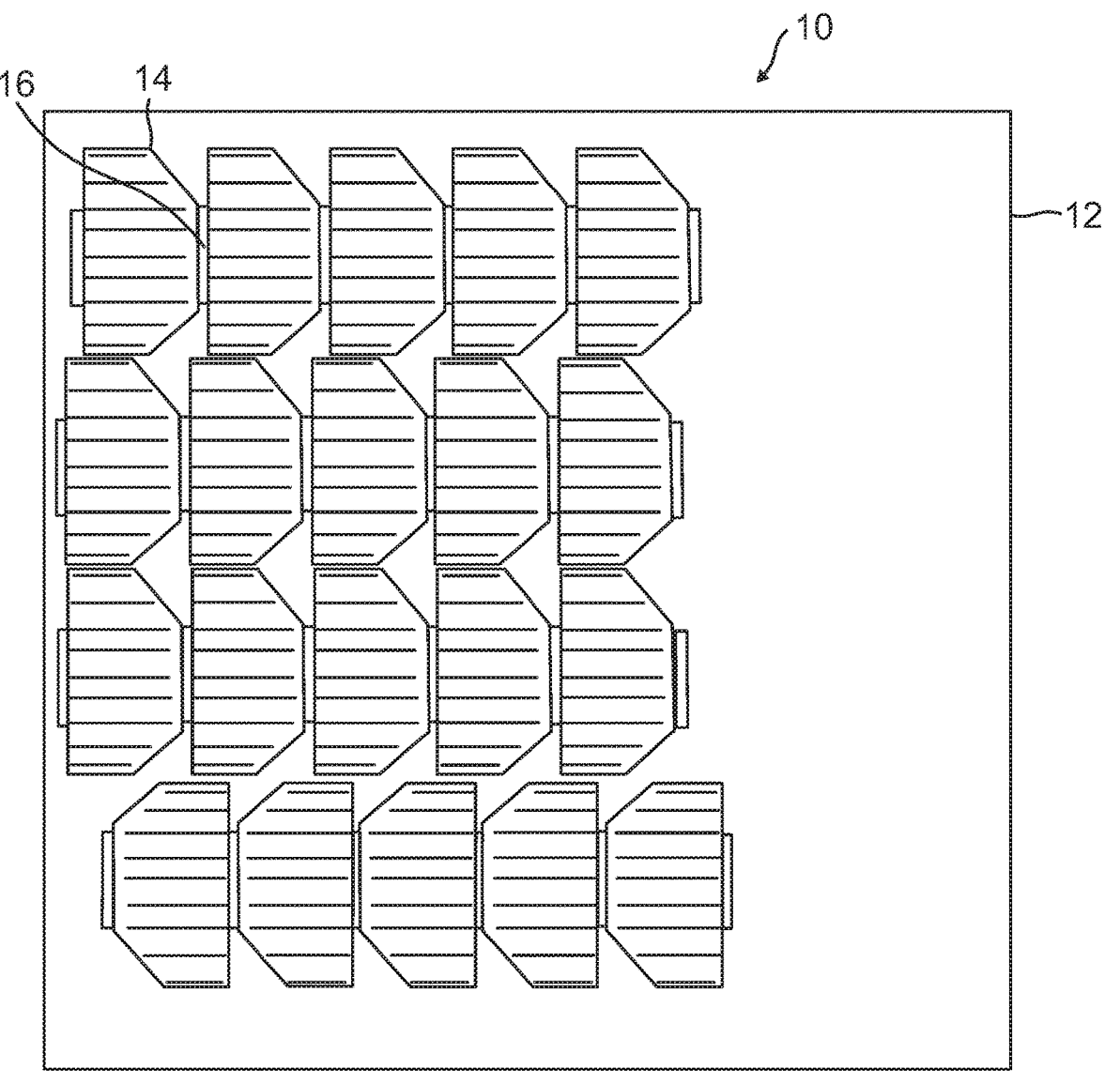
FIGS. 1 and 2 illustrate conventional structures for solar cell panels.
Figure 2:
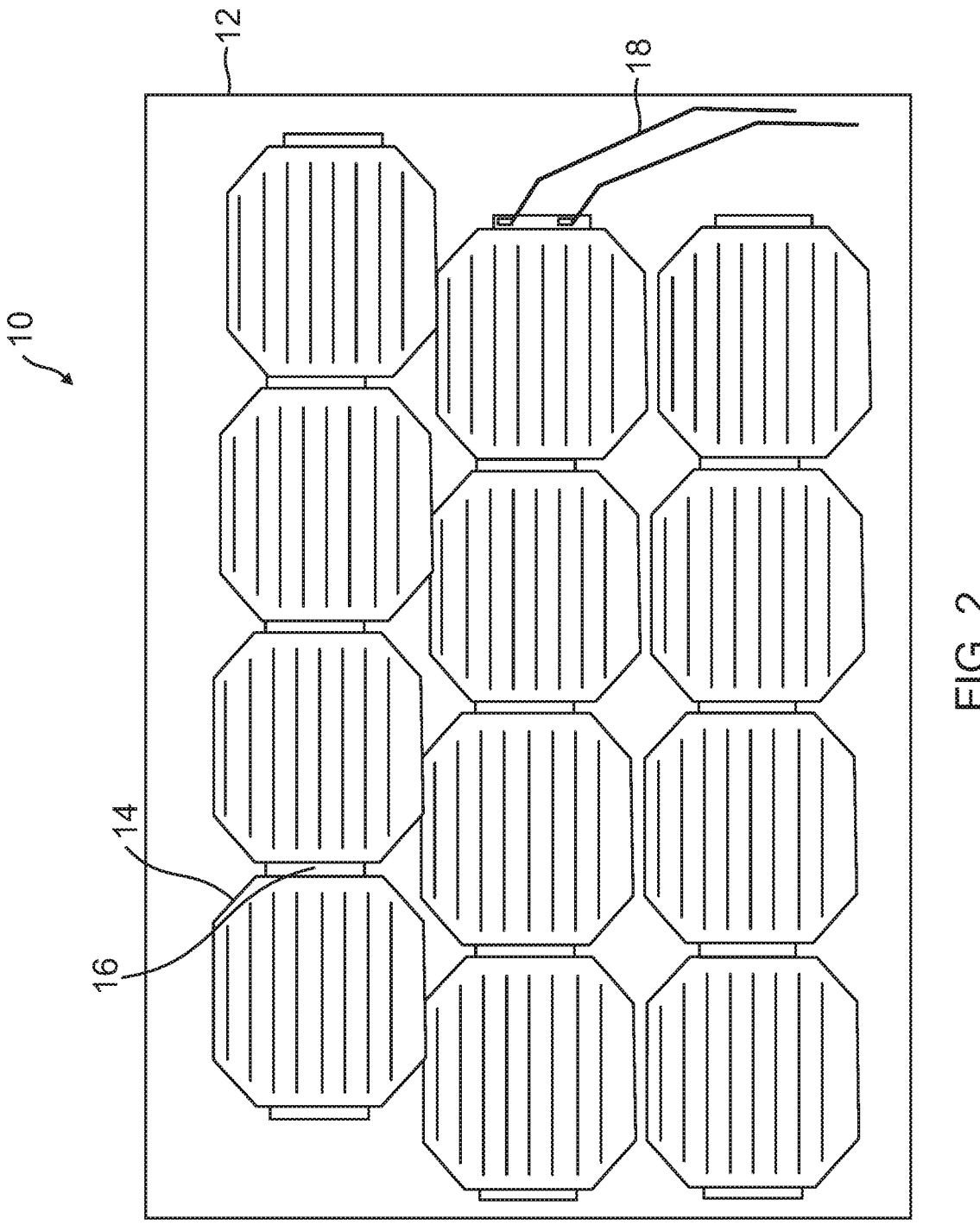

FIGS. 1 and 2 illustrate conventional structures for solar cell panels 10, which include a substrate 12, a plurality of solar cells 14 arranged in an array, and electrical connectors 16 between the solar cells 14. Half size solar cells 14 are shown in FIG. 1 and full size solar cells 14 are shown in FIG. 2. Space solar cells 14 are derived from a round Germanium (Ge) substrate starting material, which is later fabricated into semi-rectangular shapes to improve dense packing onto the solar cell panel 10. This wafer is often diced into one or two solar cells 14 herein described as half size or full size solar cells 14. The electrical connectors 16 providing electrical connections between solar cells 14 are made along the long parallel edge between solar cells 14. These series connections (cell-to-cell) are completed off-substrate, as strings of connected solar cells 14 are built having lengths of any number of solar cells 14. The completed strings of solar cells 14 are then applied and attached to the substrate 12.

In FIG. 2, wiring 18 is attached at the end of a string of solar cells 14 to electrically connect the string to other strings, or to terminate the resulting circuit and bring the current off of the array of solar cells 14. String-to-string and circuit termination connections are typically done on the substrate 12, and typically using wiring 18. However, some solar cell panels 10 use a printed circuit board (PCB)-type material with embedded conductors.

Adjacent strings of connected solar cells 14 can run parallel or anti-parallel. In addition, strings of connected solar cells 14 can be aligned or misaligned. There are many competing influences to the solar cell 14 layout resulting in regions where solar cells 14 are parallel or anti-parallel, aligned or misaligned.

Figures 3A, 3B:
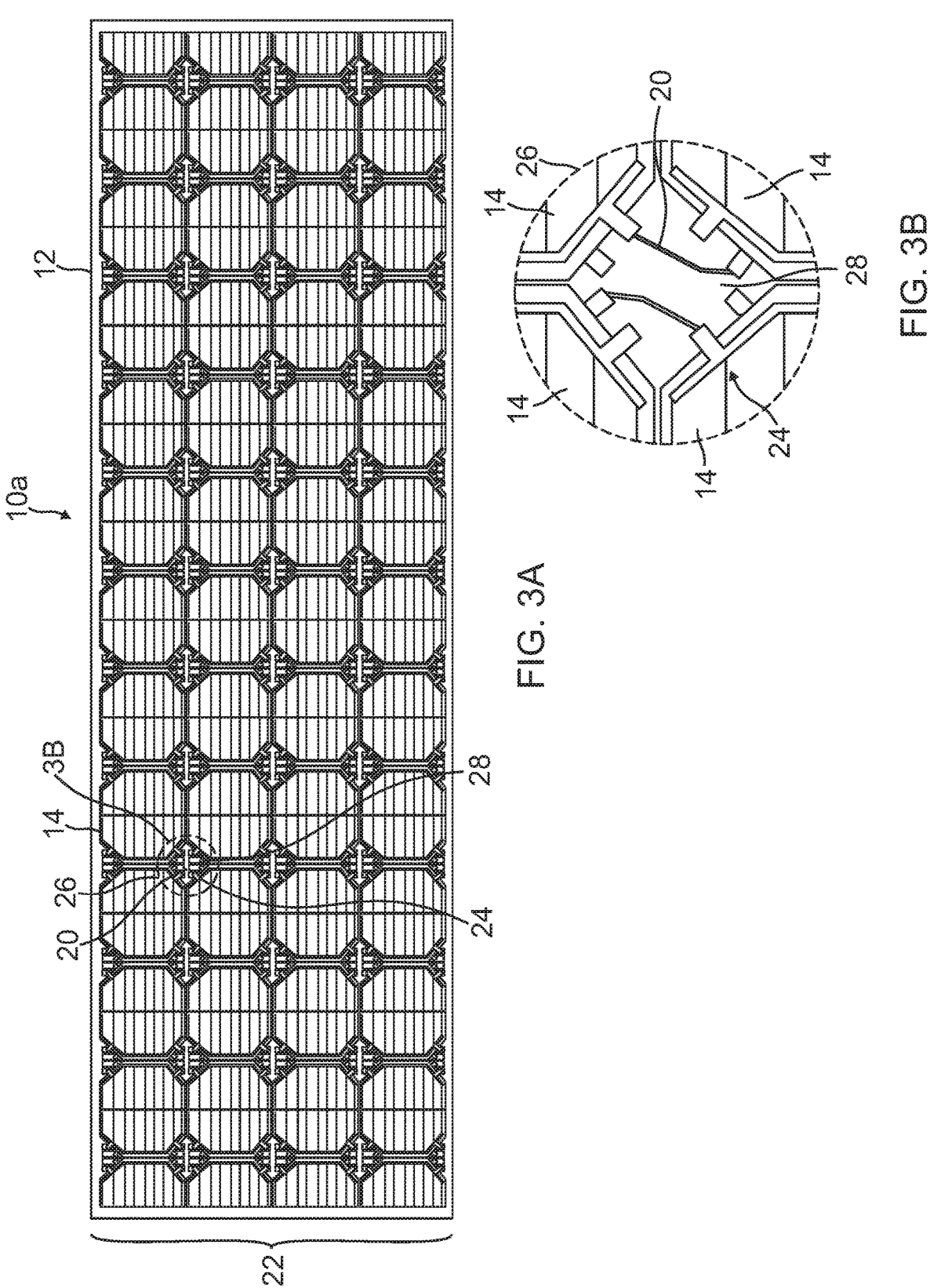
FIGS. 3A and 3B illustrate an improved structure for a solar cell panel, according to one example.

FIGS. 3A-3B illustrate an improved structure for a solar cell panel 10a, according to one example, wherein FIG. 3B is an enlarged view of the details in the dashed circle in FIG. 3A. The various components of the solar cell panel 10a are shown and described in greater detail in FIGS. 5-13.

The solar cell panel 10a includes a substrate 12 for solar cells 14 having one or more corner conductors 20 thereon. In one example, the substrate 12 is a multi-layer substrate 12 comprised of one or more Kapton® (polyimide) layers separating one or more patterned metal layers. The substrate 12 may be mounted on a large rigid panel 10a similar to conventional assembles. Alternatively, substrate 12 can be mounted to a lighter more sparse frame or panel 10a for mounting or deployment.

A plurality of solar cells 14 are attached to the substrate 12 in a two-dimensional (2D) grid of an array 22. In this example, the array 22 is comprised of ninety-six (96) solar cells 14 arranged in four (4) rows by twenty-four (24) columns, but it is recognized that any number of solar cells 14 may be used in different implementations.

At least one of the solar cells 14 has at least one cropped corner 24 that defines a corner region 26, as indicated by the dashed circle. The solar cells 14 are attached to the substrate 12, such that corner regions 26 of adjacent ones of the solar cells 14 are aligned, thereby exposing an area 28 of the substrate 12. The area 28 of the substrate 12 that is exposed includes one or more of the corner conductors 20, and one or more electrical connections between the solar cells 14 and the corner conductors 20 are made in the corner regions 26 resulting from the cropped corners 24 of the solar cells 14.

In this example, the corner conductors 20 are conductive paths attached to, printed on, buried in, or deposited on the substrate 12, before and/or after the solar cells 14 are attached to the substrate 12, which facilitate connections between adjacent solar cells 14. The connections between the solar cells 14 and the corner conductors 20 are made after the solar cells 14 have been attached to the substrate 12.

In one example, four adjacent solar cells 14 are aligned on the substrate 12, such that four cropped corners 24, one from each solar cell 14, are brought together at the corner regions 26. The solar cells 14 are then individually attached to the substrate 12, wherein the solar cells 14 are placed on top of the corner conductors 20 to make the electrical connection between the solar cells 14 and the corner conductors 20.

The solar cells 14 may be applied to the substrate 12 as CIC (cell, interconnect and coverglass) units. Alternatively, bare solar cells 14 may be assembled on the substrate 12, and then interconnects applied to the solar cells 14, followed by the application of a single solar cell 14 coverglass, multiple solar cell 14 coverglass, multiple solar cell 14 polymer coversheet, or spray encapsulation. This assembly protects the solar cells 14 from damage that would limit performance.

Figures 4A, 4B:
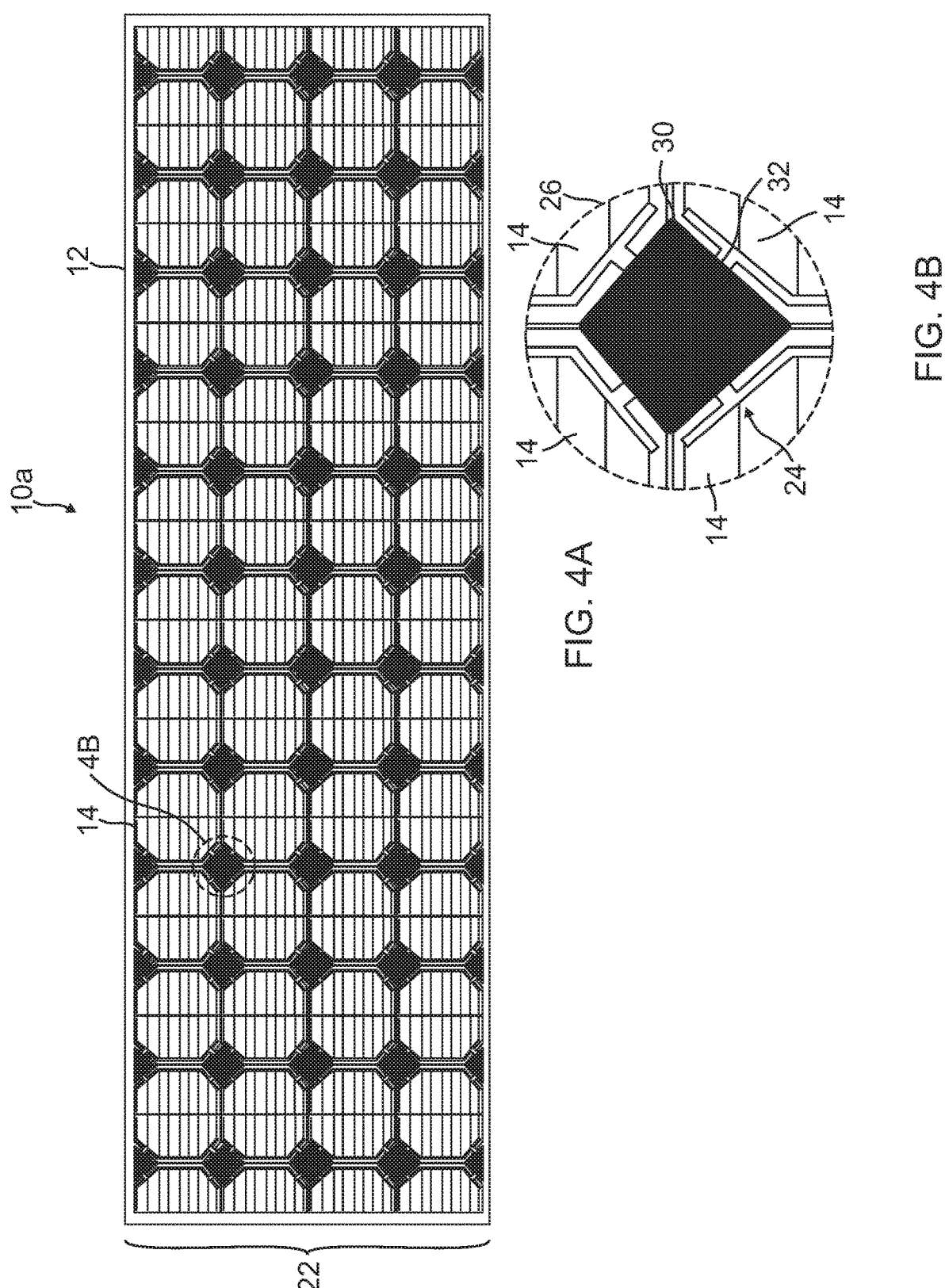
FIGS. 4A and 4B illustrate an alternative structure for the solar cell panel, according to one example.

FIGS. 4A and 4B illustrate an alternative structure for the solar cell panel 10a, according to one example, wherein FIG. 4B is an enlarged view of the details in the dashed circle in FIG. 4A. In this example, only a few corner conductors 20 are printed on or integrated with the substrate 12. Instead, most of the corner conductors 20 are contained within a power routing module (PRM) 30 that is attached to the substrate 12, as described in more detail below in conjunction with FIGS. 14-23.

Figure 5:
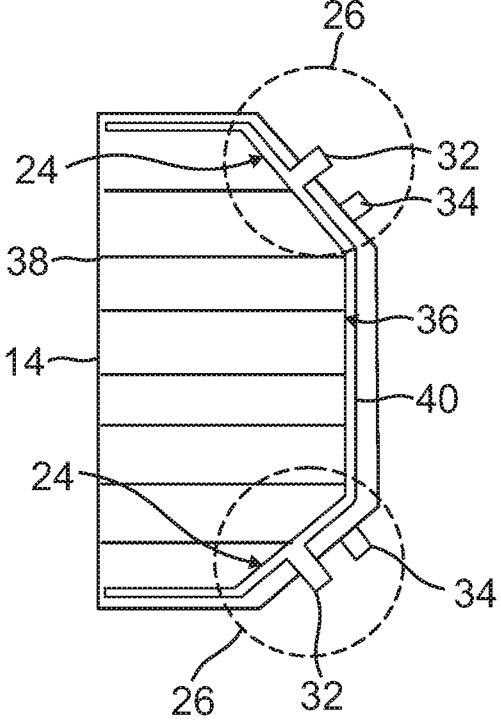
FIG. 5 illustrates the front side of an exemplary solar cell that may be used in the improved solar cell panel of FIGS. 3A-3B and 4A-4B.

FIG. 5 illustrates the front side of an exemplary solar cell 14 that may be used in the improved solar cell panel 10a of FIGS. 3A-3B and 4A-4B. The solar cell 14, which is a CIC unit, is a half-size solar cell 14. (Full-size solar cells 14 could also be used.)

The solar cell 14 is fabricated having at least one cropped corner 24 that defines a corner region 26, as indicated by the dashed circle, such that the corner region 26 resulting from the cropped corner 24 includes at least one contact 32, 34 for making an electrical connection to the solar cell 14. In the example of FIG. 5, the solar cell 14 has two cropped corners 24, each of which has both a front contact 32 on the front side of the solar cell 14 and a back contact 34 on a back side of the solar cell 14, where the contacts 32 and 34 extend into the corner region 26. (Full-size solar cells 14 would have four cropped corners 24, each of which would have a front contact 32 and a back contact 34.)

The cropped corners 24 increase utilization of the round wafer starting materials for the solar cells 14. In conventional panels 10, these cropped corners 24 would result in unused space on the panel 10 after the solar cells 14 are attached to the substrate 12. The new approach described in this disclosure, however, utilizes this unused space. Specifically, metal foil interconnects, comprising the corner conductors 20, front contacts 32 and back contacts 34, are moved to the corner regions 26. In contrast, existing CICs have interconnects attached to the solar cell 14 front side, and connect to the back side (where connections occur) during stringing.

The current generated by the solar cell 14 is collected on the front side of the solar cell 14 by a grid 36 of thin metal fingers 38 and wider metal bus bars 40 that are connected to both of the front contacts 32. There is a balance between the addition of metal in grid 36, which reduces the light entering the solar cell 14 and its output power, and the reduced resistance of having more metal. The bus bar 40 is a low resistance conductor that carries high currents and also provides redundancy should a front contact 32 become disconnected. Optimization generally desires a short bus bar 40 running directly between the front contacts 32. Having the front contact 32 in the cropped corner 24 results in moving the bus bar 40 away from the perimeter of the solar cell 14. This is achieved while simultaneously minimizing the bus bar 40 length and light obscuration. Additionally, the fingers 38 are now shorter. This reduces parasitic resistances in the grid 36, because the length of the fingers 38 is shorter and the total current carried is less. This produces a design preference where the front contacts 32 and connecting bus bar 40 is moved to provide shorter narrow fingers 38.

Figure 6:
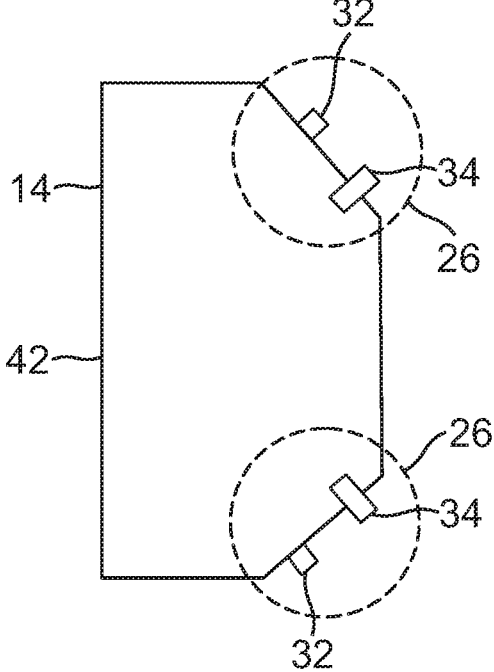
FIG. 6 illustrates the back side of the exemplary solar cell of FIG. 5.

FIG. 6 illustrates the back side of the exemplary solar cell 14 of FIG. 5. The back side of the solar cell 14 has a back layer 42 that is connected to both of the back contacts 34.

Figure 7:
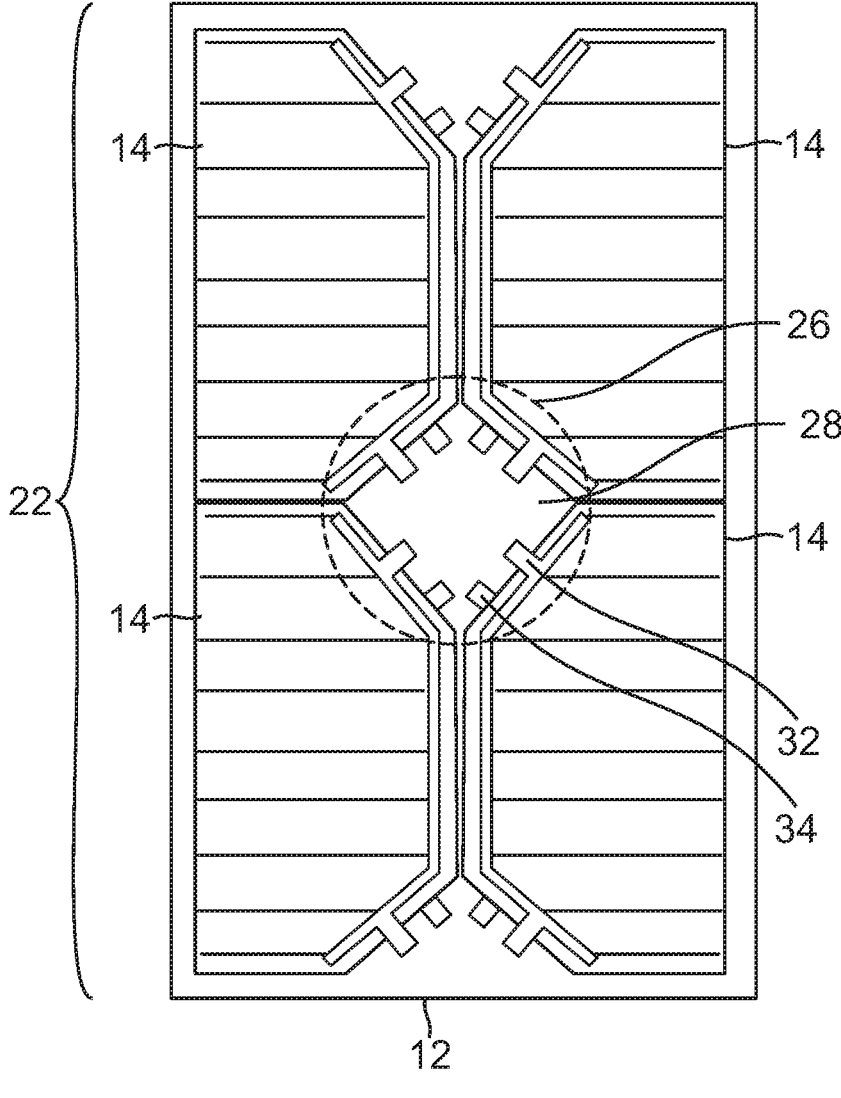
FIG. 7 illustrates cells arranged into a two-dimensional (2D) grid of an array, according to one example.

FIG. 7 illustrates solar cells 14 arranged into the 2D grid of the array 22, according to one example. The array 22 comprises a plurality of solar cells 14 attached to a substrate 12, such that corner regions 26 of adjacent ones of the solar cells 14 are aligned, thereby exposing an area 28 of the substrate 12. Electrical connections (not shown) between the solar cells 14 are made in the exposed area 28 of the substrate 12 using the front contacts 32 and back contacts 34 of the solar cells 14 and corner conductors 20 (not shown) formed on or in the exposed area 28 of the substrate 12.

During assembly, the solar cells 14 are individually attached to the substrate 12. This assembly can be done directly on a support surface, i.e., the substrate 12, which can be either rigid or flexible. Alternatively, the solar cells 14 could be assembled into the 2D grid of the array 22 on a temporary support surface and then transferred to a final support surface, i.e., the substrate 12.

Figure 8:
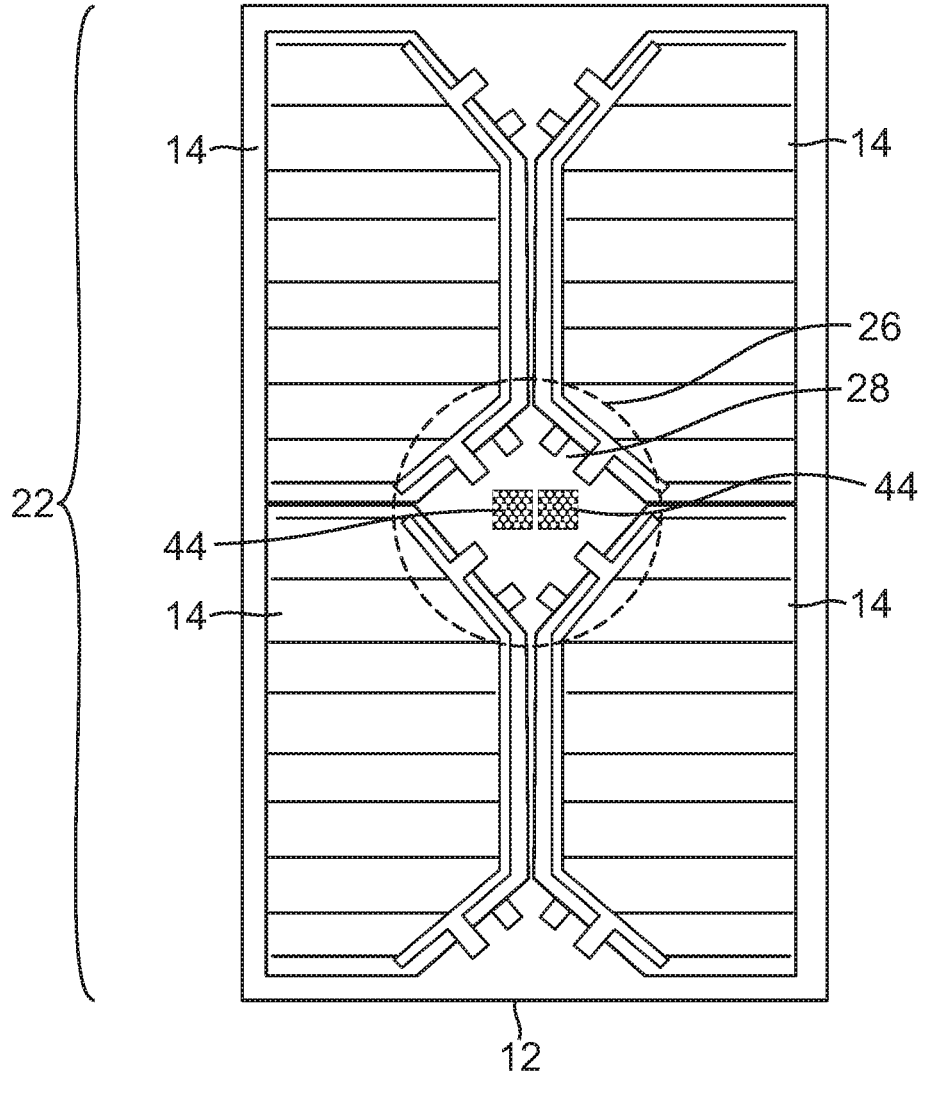
FIG. 8 illustrates an example of the array where one or more bypass diodes are added to the exposed area of the substrate in the corner regions.

FIG. 8 illustrates an example of the array 22 where one or more bypass diodes 44 are added to the exposed area 28 of the substrate 12 in the corner regions 26, for use in one or more of the electrical connections. The bypass diodes 44 protect the solar cells 14 when the solar cells 14 become unable to generate current, which could be due to being partially shadowed, which drives the solar cells 14 into reverse bias. In one example, the bypass diodes 44 are attached to the substrate 12 in the corner regions 26 independent of the solar cells 14.

Figure 9:
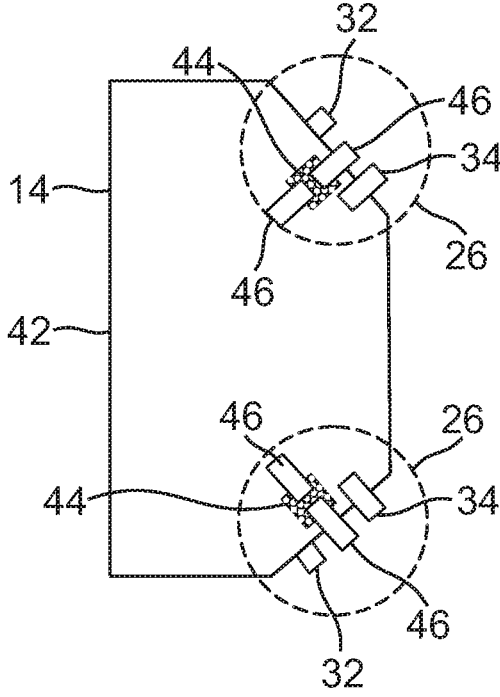
FIG. 9 illustrates an example where the bypass diode is applied to the back side of the cell, with an interconnect or contact for the bypass diode extending into the corner region between front and back contacts.

FIG. 9 illustrates an example where the bypass diode 44 is applied to the back side of the solar cell 14, with interconnects or contacts 46 for the bypass diode 44 connected to the back layer 42 and also extending into the corner region 26 between the front and back contacts 32, 34.

Figure 10:
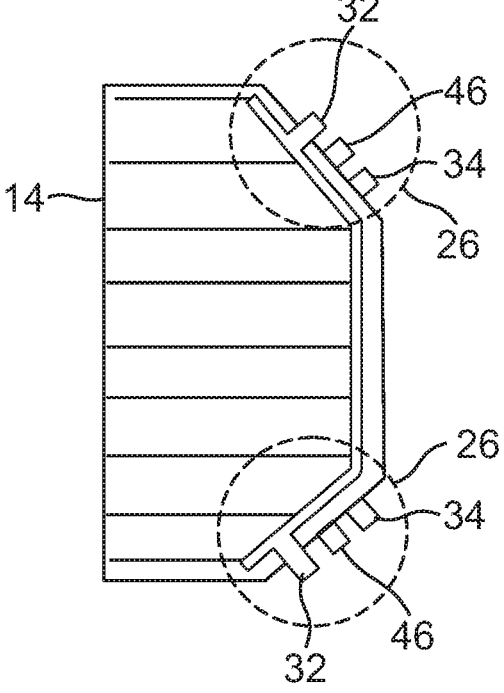
FIG. 10 illustrates a front side view of the example of FIG. 9, with the interconnect or contact for the bypass diode extending into the corner region between the front and back contacts.

FIG. 10 illustrates a front side view of the example of FIG. 9, with the interconnect or contact 46 for the bypass diode 44 (not shown) extending into the corner region 26 between the front and back contacts 32, 34.

Figure 11:
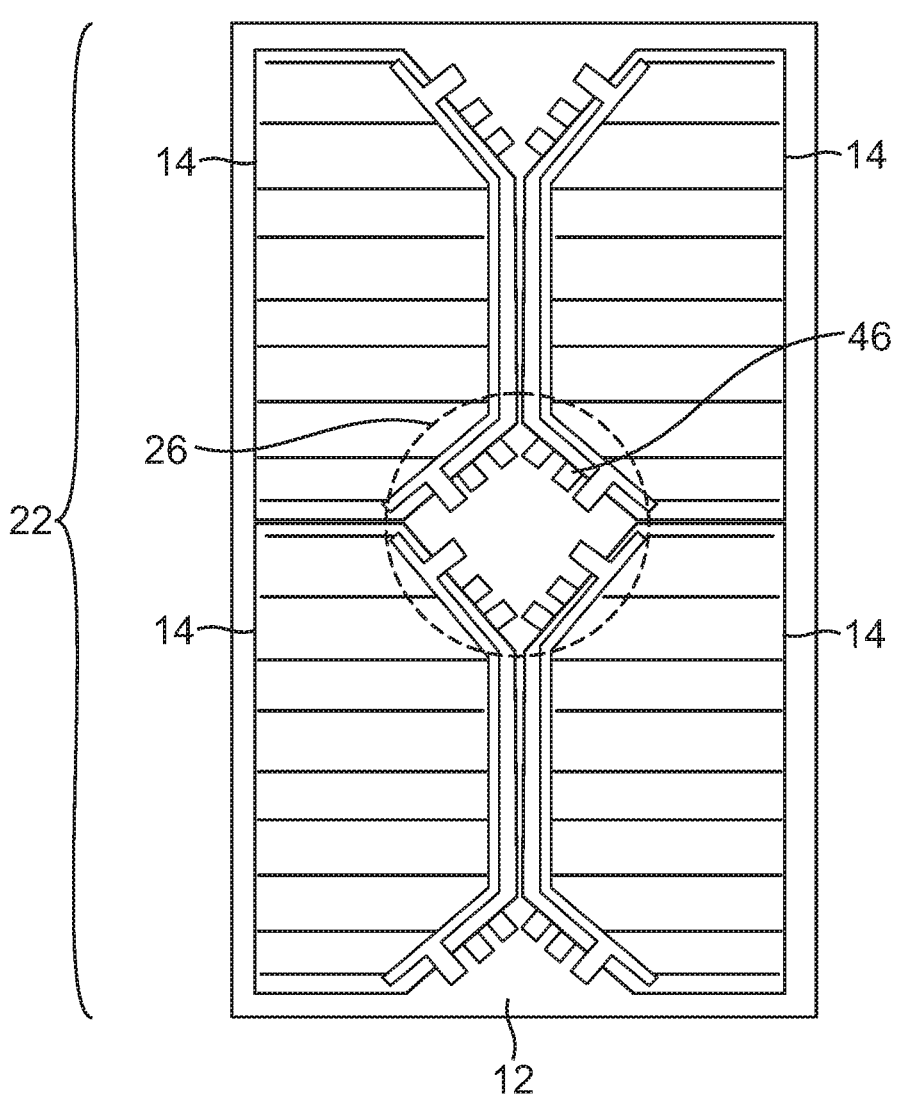
FIG. 11 illustrates the cells of FIGS. 9 and 10 arranged into the 2D grid of the array and applied to the substrate, where the bypass diodes are applied to the back side of the cells, with the contacts for the bypass diodes extending into the corner regions of the cells.

FIG. 11 illustrates the solar cells 14 of FIGS. 9 and 10 arranged into the 2D grid of the array 22 and applied to the substrate 12, where the bypass diodes 44 (not shown) are applied to the back side of the solar cells 14, with the contacts 46 for the bypass diodes 44 extending into corner regions 26 of the solar cells 14.

One advantage of this approach is that the layouts illustrated in FIGS. 7, 8 and 11 are generalized layouts. Specifically, these layouts can be repeated across any panel 10a dimensions desired by a customer. This greatly simplifies assembly, rework, test, and inspection processes.

Following solar cell 14 and bypass diode 44 placement, there is another step where customization is accomplished. The front contacts 32 and back contacts 34 in the corner regions 26 of the solar cells 14 must be connected. This can be done in many combinations in order to route current through a desired path.

After attaching solar cells 14 to the substrate 12, connections are made between the solar cells 14 and the corner conductors 20. Front and back contacts 32, 34 of the solar cells 14 are present in each corner region 26 for attachment to the corner conductors 20. Interconnects for the front and back contacts 32, 34 of each of the solar cells 14 are welded, soldered, or otherwise bonded onto the corner conductors 20 to provide a conductive path 20, 32, 34 for routing current out of the solar cells 14.

Using the corner conductors 20, any customization can be made in the electrical connections. Adjacent solar cells 14 can be electrically connected to flow current in up/down or left/right directions as desired by the specific design. Current flow can also be routed around stayout zones as needed. The length or width of the solar cell array 22 can be set as desired. Also, the width can vary over the length of the array 22.

Figure 12:
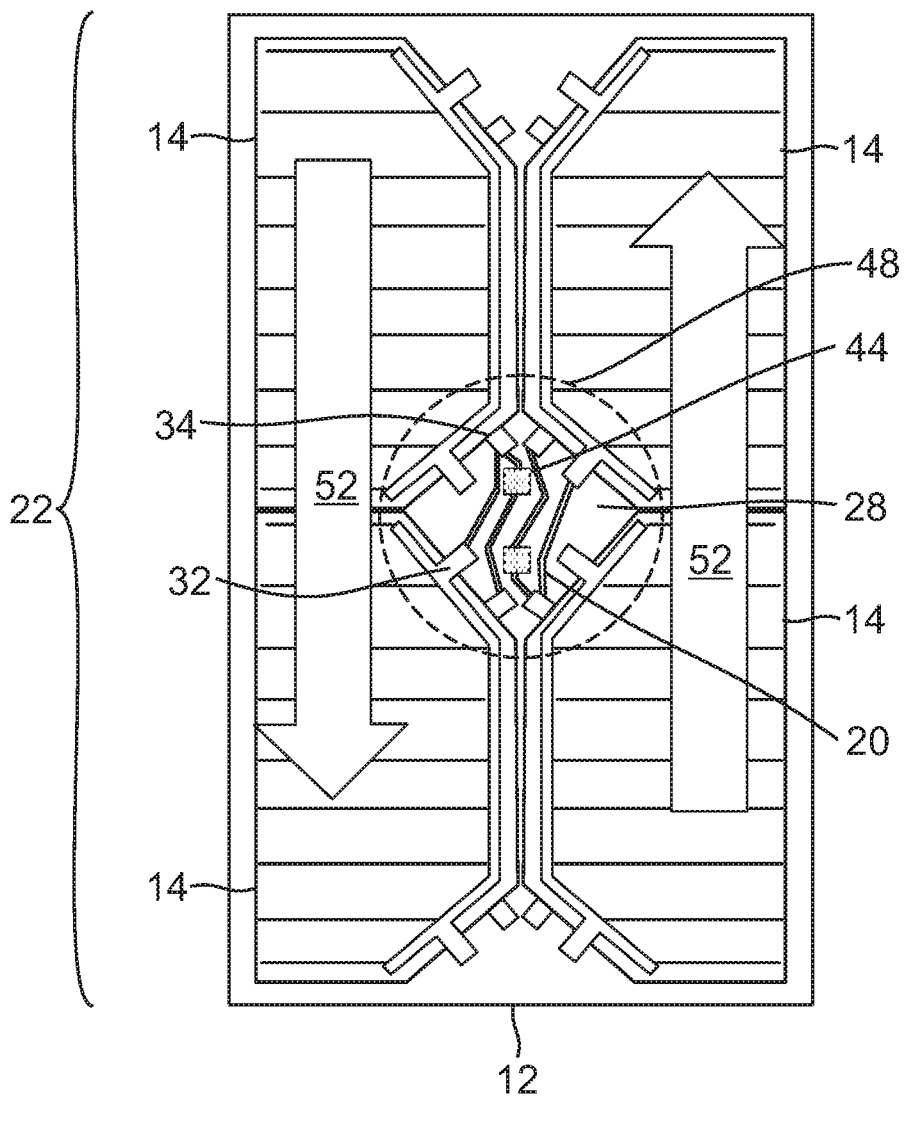
FIG. 12 shows up/down series connections between the cells of the array, according to one example.
Figure 13:
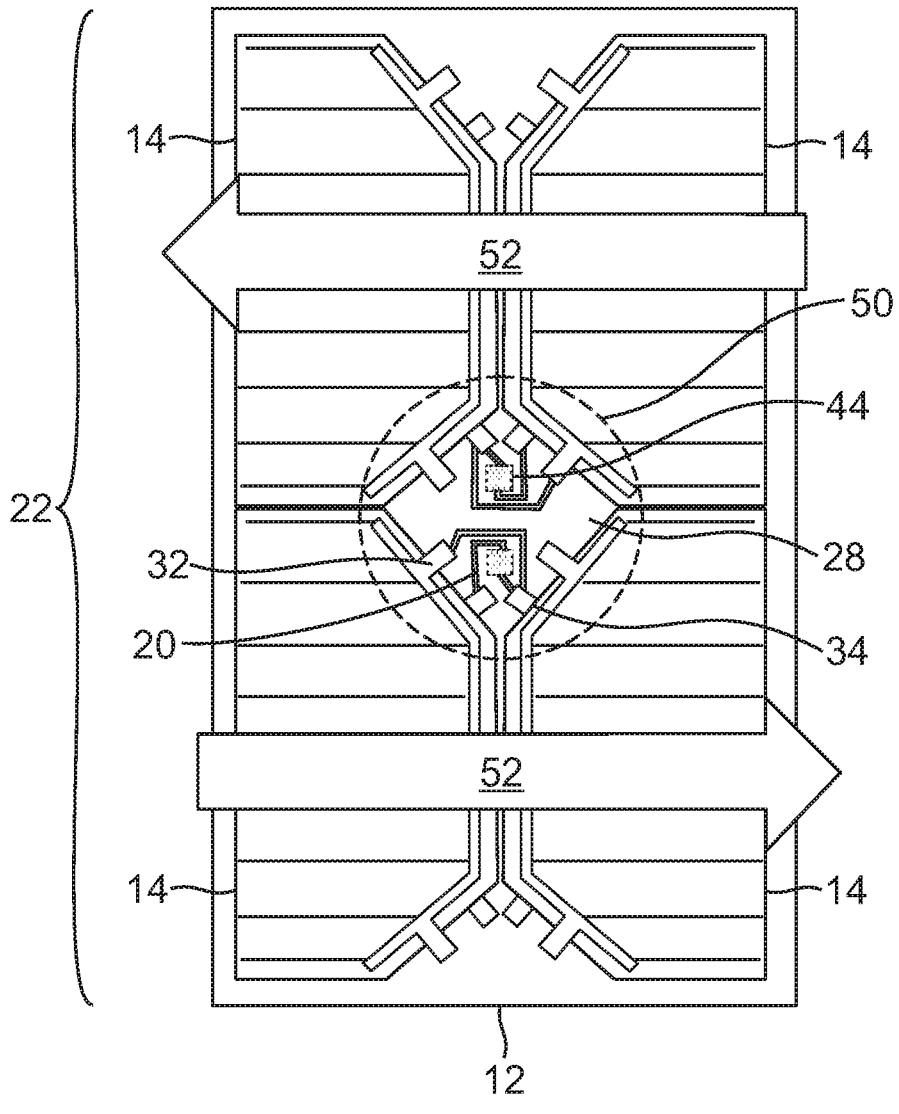
FIG. 13 shows left/right series connections between the cells of the array, according to one example.

In one example, the electrical connections are series connections that determine a flow of current through the plurality of solar cells 14. This may be accomplished by the connection schemes shown in FIGS. 12 and 13, wherein FIG. 12 shows up/down series connections 48 between the solar cells 14 of the array 22, and FIG. 13 shows left/right series connections 50 between the solar cells 14 of the array 22. In both FIGS. 12 and 13, these series connections 48, 50 are electrical connections between the front contacts 32 and back contacts 34 of the solar cells 14, and the bypass diodes 44, are made using the corner conductors 20 formed on or in the exposed areas 28 of the substrate 12. These series connections 48, 50 determine the current (power) flow, as indicated by the arrows 52, through the solar cells 14, in contrast to the assembly of large strings off-substrate.

The corner conductors 20 between solar cells 14 can be in many forms. They could be accomplished using wires that have electrical connections made on both ends, which could be from soldering, welding, conducting adhesive, or other process. In addition to wires, metal foil connectors, similar to the interconnects, could be applied. Metal conductive paths or traces (not shown) can also be integrated with the substrate 12.

In summary, this new approach attaches the solar cells 14 individually to a substrate 12 such that the corner regions 26 of two, three or four adjacent solar cells 14 are aligned on the substrate 12. The solar cells 14 can be laid out so that the cropped corners 24 are aligned and the corner regions 26 are adjacent, thereby exposing an area 28 of the substrate 12. Electrical connections between solar cells 14 are made in these corner regions 26 between front contacts 32 and back contacts 34 on the solar cells 14, bypass diodes 44, and corner conductors 20 on or in the exposed area 28 of the substrate 12, wherein these conductive paths are used to create a string of solar cells 14 in a series connection 48, 50 comprising a circuit.

Power Routing Module

While the use of electrical connections between solar cells 14 in the corner regions 26 facilitates automation, there is still a need for a variety of corner conductors 20 that can achieve various configurations to enable the customization needed by customers. However, this may require many corner conductors 20 in the corner regions 26, which would result in corner conductors 20 being closely spaced, raising electrostatic discharge (ESD) concerns.

On the other hand, to maximize power generation from the array of solar cells 14, it is desirable to have corner regions 26 that are as small as possible. Large solar cells 14 are desirable for reducing labor and parts cost during assembly. However, the design described herein changes this assessment, with the result that smaller solar cells 14 have little cost penalty. Smaller solar cells 14 have advantages in filling the wafer area, as well as filling the panels 10a. Smaller solar cells 14 mean better utilization of material and effort. However, smaller solar cells 14 also mean smaller cropped corners 24 and smaller corner regions 26, which causes problems for the connection strategy.

This disclosure describes the PRM 30 for customizing the corner conductors 20 used in the corner regions 26, wherein the PRM 30 is attached to the substrate 12 in the corner regions 26. Rather than form all of the corner conductors 20 on the substrate 12, most of the corner conductors 20 are contained within the PRM 30. Different versions of the PRM 30 having different conductor 20 layouts (e.g., 2D or 3D) can be selected to produce the desired connection layout for the array 22.

Figure 14:
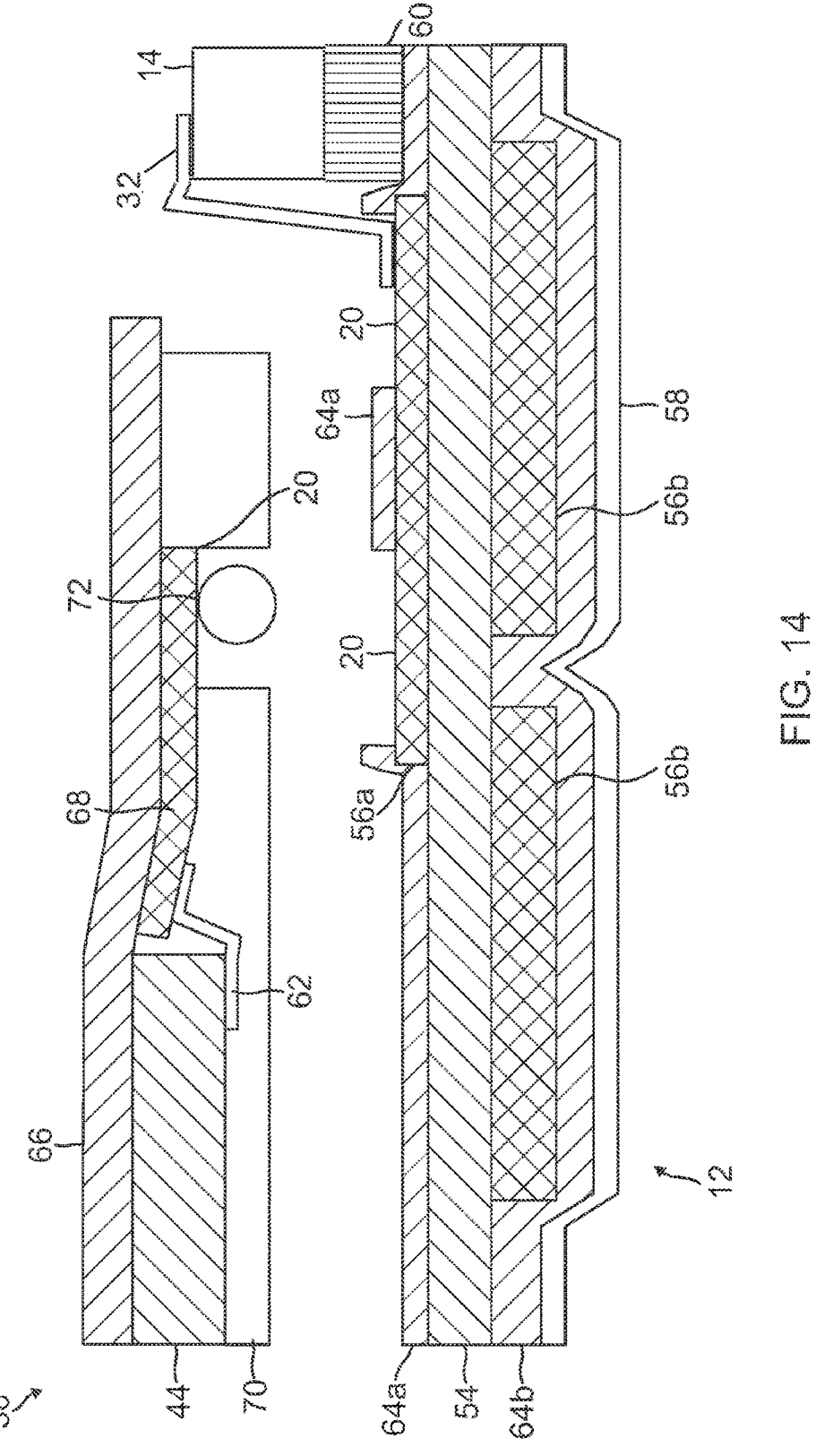
FIG. 14 is a schematic side view of an example with a substrate below and a power routing module above, wherein the substrate is a flex sheet assembly.

FIG. 14 is a schematic side view of an example with a substrate 12 below and a PRM 30 above, wherein the substrate 12 is a flex sheet assembly, according to one example. The substrate 12 includes a polyimide base layer 54 with Copper (Cu) layer 56a above and Cu layer 56b below, wherein Cu layers 56a and 56b form a multilayer conductor. The Cu layer 56a is patterned as the corner conductors 20, and the Cu layer 56b is patterned to form buried conductors within the substrate 12, including, for example, V+, V−, and bridging lines. A conducting back sheet of polyimide 58 can be applied to the substrate 12, which is useful in a space environment in that it will reduce the accumulation of charge.

Shown on the right side is the solar cell 14 that is attached to the substrate 12 with adhesive 60. Also visible is the front contact 32 of the solar cell 14 and the corner conductors 20.

The substrate 12 also includes insulating layers that separate at least one of the multilayer conductors 56a, 56b from at least another one of the multilayer conductors 56a, 56b. In one example, there are a top polyimide overlay layer 64a and bottom polyimide overlay layer 64b. Polyimide has a high breakdown strength, greater than air or vacuum, and the polyimide overlay layers 64a, 64b are useful for preventing ESD, which is an important concern in a space environment.

The PRM 30 is positioned above the substrate 12 for electrically interconnecting the solar cells 14 in the array 22. The PRM 30 is comprised of an insulation layer comprising a polyimide base layer 66 and an electrically conductive layer comprising a single Cu layer 68 deposited thereon. The Cu layer 68, which comprises one or more corner conductors 20, is used for electrically interconnecting the solar cells 14, and the polyimide base layer 66 is used for electrically insulating the corner conductors 20 of the Cu layer 68.

While the base layer 66 of the PRM is shown as being polyimide, it could be chosen from a wide variety of insulators that are suitable in the use environment, including other suitable polymers, as well as ceramics, such as glass or alumina. An advantage of glass or other transparent insulators is that these could be used with a laser welding process, where the laser beam is transmitted through the insulator and the laser beam's energy is absorbed by the conductive trace 68 on the PRM 30.

The top (sun facing side) of the PRM 30 could have a highly reflective coating, such as an Al foil bonded to the polyimide. This will reflect the solar energy away reducing heating of the solar array 22 and reducing the operating temperature of the solar cells 14, which will increase power generation.

The PRM 30 may include a bypass diode 44 for protecting the solar cells 14 from a reverse bias, wherein the bypass diode 44 is connected to one or more of the corner conductors 20 of the PRM 30 by an interconnect 62. The PRM 30 may also include an adhesive 70 for attaching the PRM 30 to the substrate 12 and an electrical joint 72 for connecting one or more of the corner conductors 20 of the PRM 30 to one or more of corner conductors 20 of the substrate 12, e.g., connecting the Cu layer 66 to the Cu layer 56a.

Figure 15:
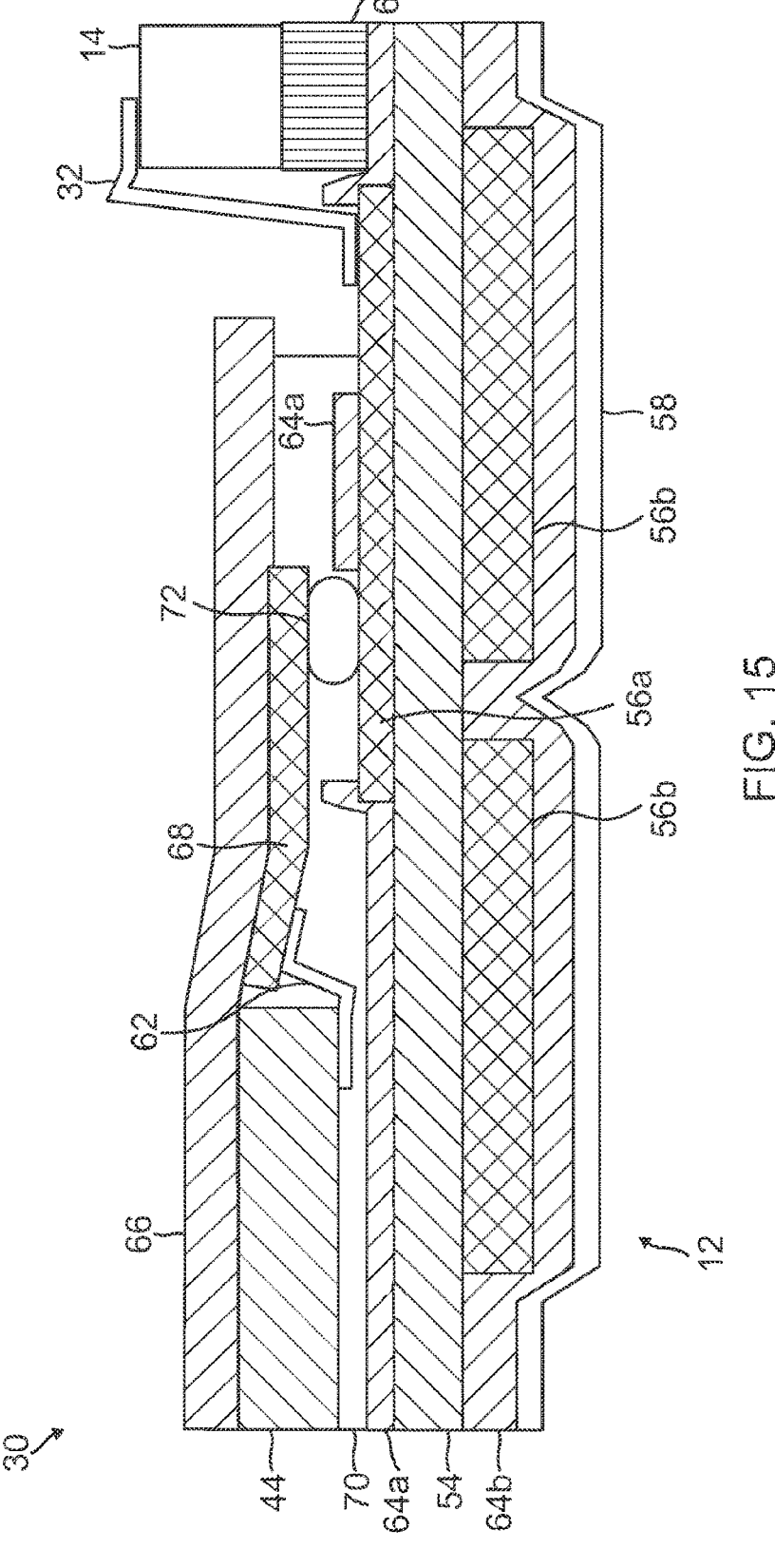
FIG. 15 is a schematic side view of an example with a substrate below and a power routing module above, with the power routing module attached to the flex sheet with an adhesive.

FIG. 15 is a schematic side view of the example from FIG. 14, with the PRM 30 attached to the substrate 12 using the adhesive 70. The PRM 30 is attached to the substrate 12 in the area 28 of the substrate 12 in the corner region 26 that remains exposed when the solar cells 14 are mounted on the substrate 12. In this example, an electrical connection is formed by the electrical joint 72 sandwiched between one or more of the corner conductors 20 of the PRM 30 and one or more of corner conductors 20 of the substrate 12, e.g., between the Cu layers 56a and 66. The electrical joint 72 could be accomplished with solder, or via a laser welding process as described above, or via an ultrasonic welding process, which connect layer 68 directly to Cu layer 56a.

Figure 16:
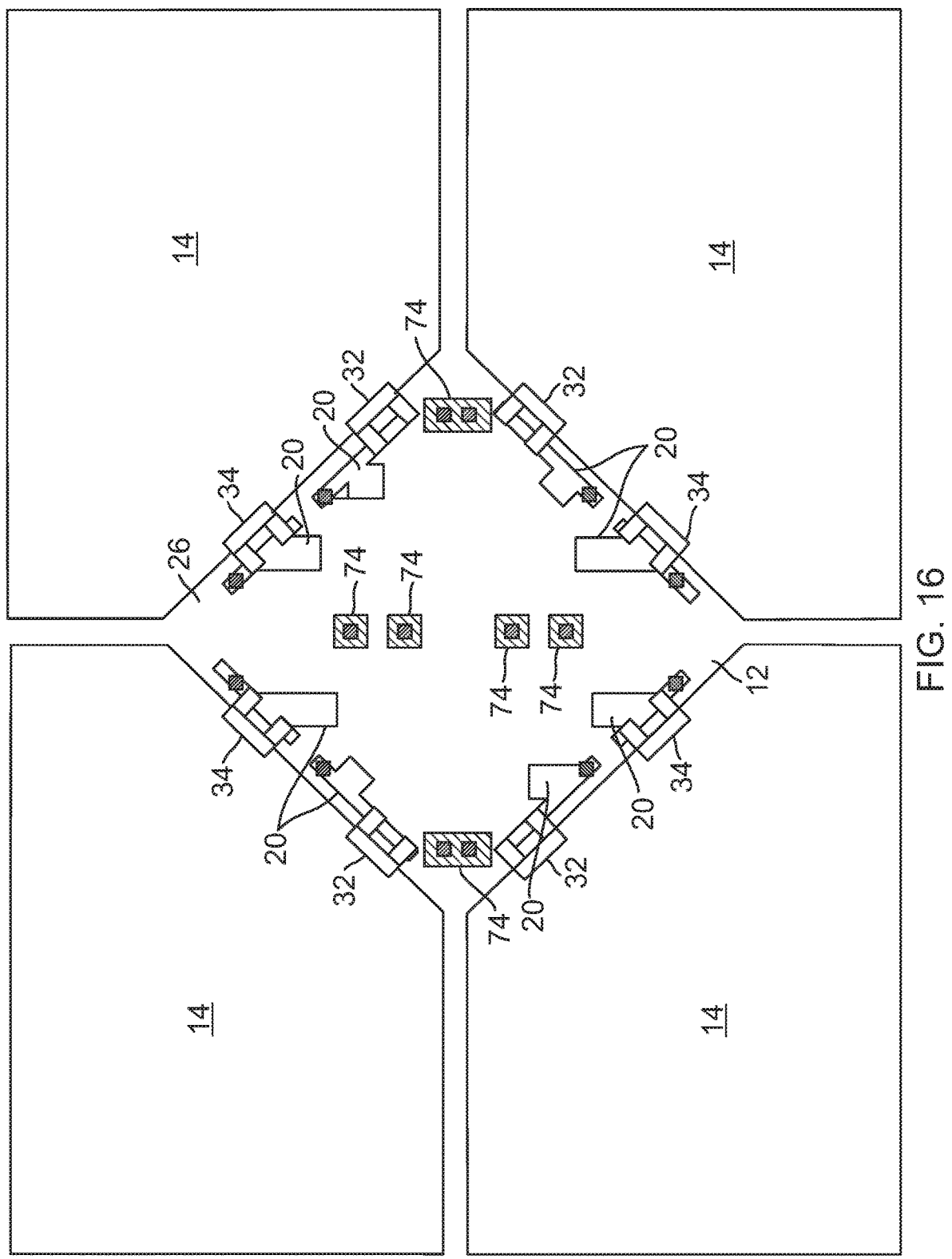
FIG. 16 is a top view of a corner region of solar cells in an array.

FIG. 16 shows a top view of the corner regions 26 of the solar cells 14 in the array 22, including the front and back contacts 32, 34, without the PRM 30 attached. There are fewer corner conductors 20 shown in this view. Also, the area 28 of the substrate 12 in the corner region 26 that remains exposed includes conducting pads 74 that provide connection points between the PRM 30 and conductive paths in the substrate 12, e.g., V+ or V− lines, bridging lines or other conductive paths buried or embedded within the substrate 12 (e.g., Cu layer 56b). This is a common design for all corner regions 26 independent of application and PRM 30.

Figure 17:
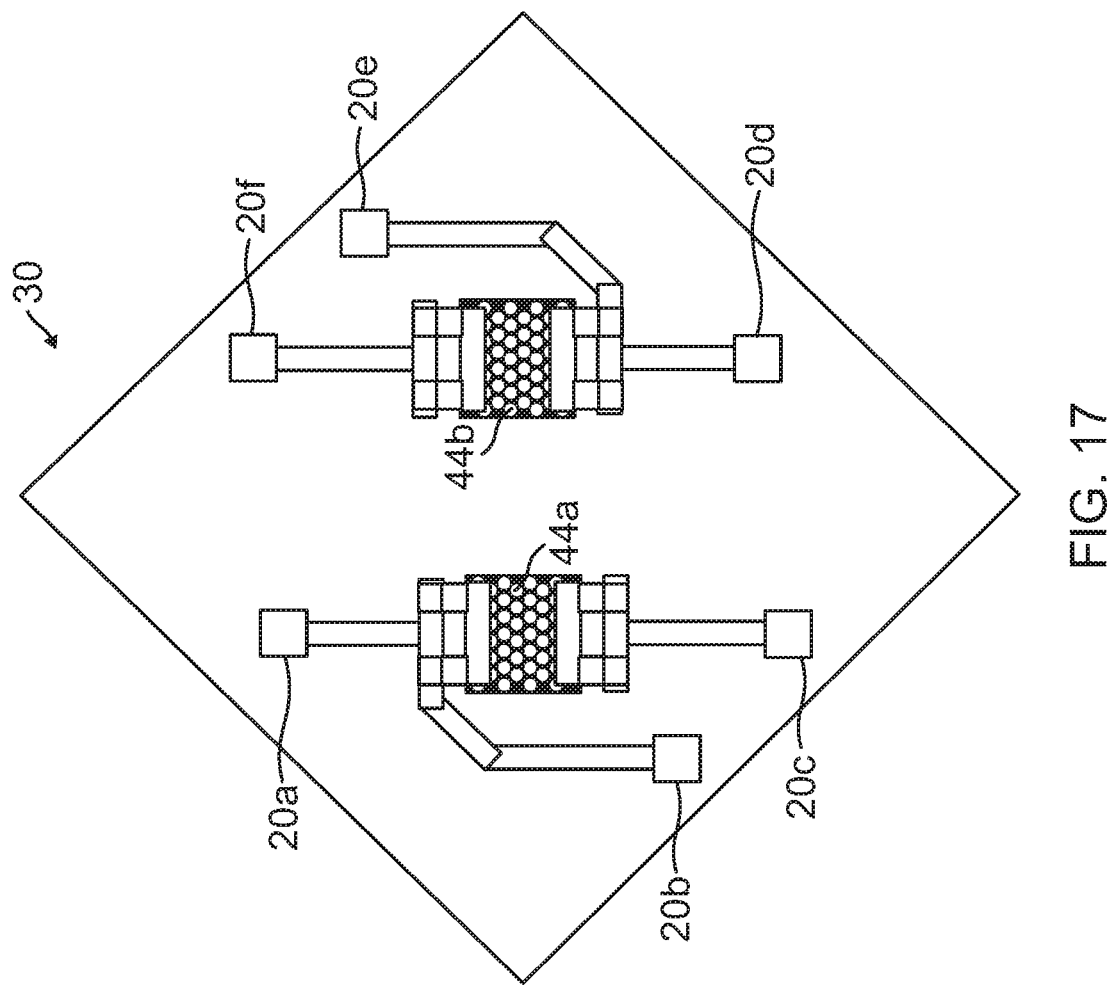
FIG. 17 shows the power routing module's structure for a series connection of the solar cells.

FIG. 17 shows one example where the PRM 30 electrically interconnects the solar cells 14 by providing a series connection 48 between the solar cells 14. Note that FIG. 17 shows the structure from the sun's perspective, looking through the polyimide base layer 64 (not shown) (the same is true for FIG. 18). Corner conductor 20a connects to the back contact 34 of the top left solar cell 14 (not shown), corner conductor 20b connects to the front contact 32 of the bottom left solar cell 14 (not shown), and corner conductor 20c connects to the back contact 34 of the bottom left solar cell 14 (not shown) through bypass diode 44a. Corner conductor 20d connects to the back contact 34 of the bottom right solar cell 14 (not shown), corner conductor 20e connects to the front contact 32 of the top right solar cell 14 (not shown), and corner conductor 20f connects to the back contact 34 of the top right solar cell 14 (not shown) through bypass diode 44b.

Note that, with minor modifications, the PRMs 30 can be rotated to change the functionality of the connections between solar cells 14. For example, the PRM 30 of FIG. 17 could be rotated to provide a left/right series connection 50.

Figure 18:
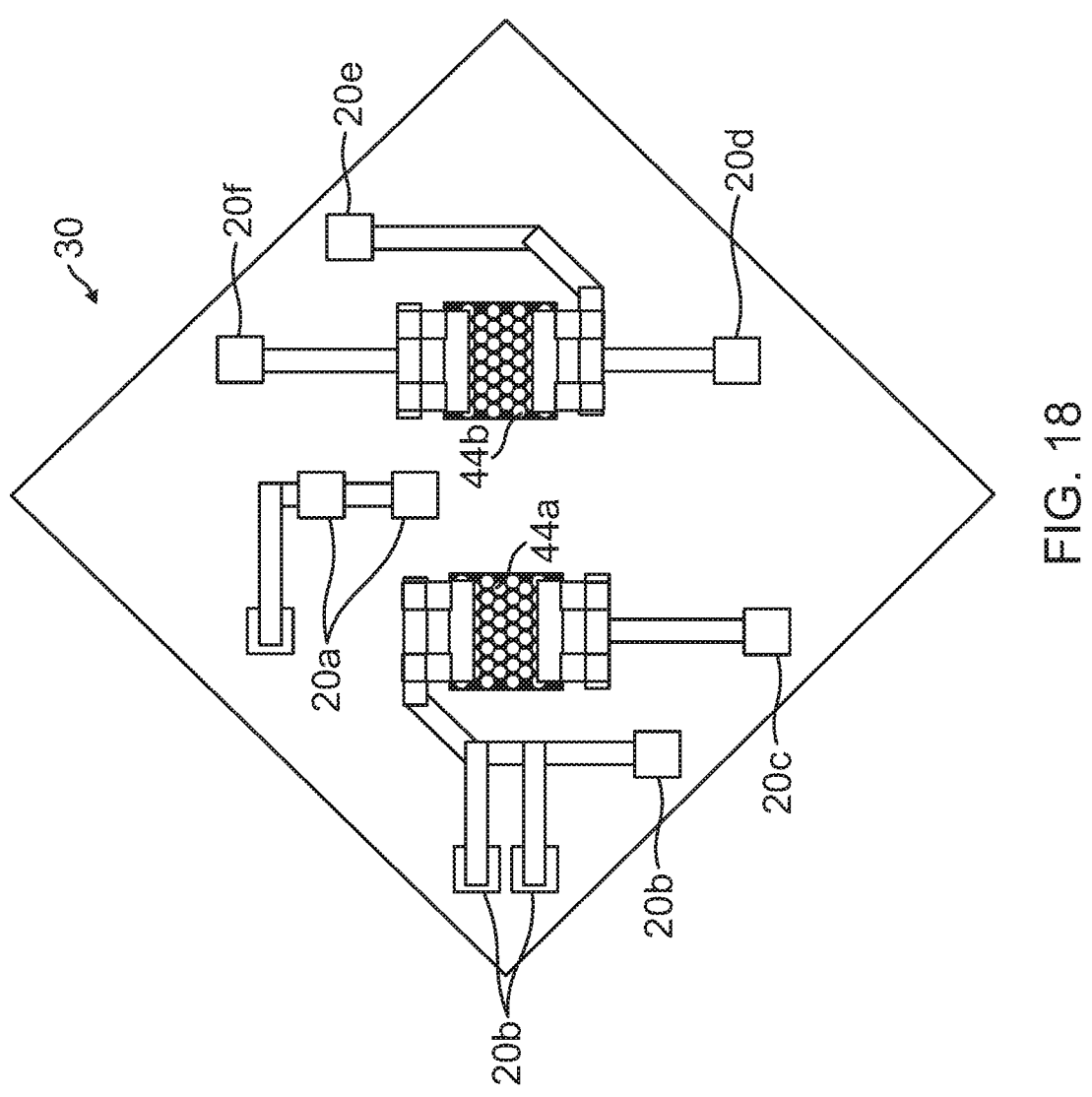
FIG. 18 shows a variation of the power routing module attached to the solar cells in the array.

FIG. 18 shows another example where the PRM 30 electrically interconnects the solar cells 14 with one or more power lines in the substrate 12. In this example, corner conductor 20a terminates the back contact 34 of the top left solar cell 14 (not shown) to pads 74 for a buried V+ line (not shown), corner conductor 20b terminates the front contact 32 of the bottom left solar cell 14 (not shown) to pads 74 for a buried V− (common) line (not shown), and corner conductor 20c connects to the back contact 34 of the bottom left solar cell 14 (not shown) through bypass diode 44*a*. Both corner conductors 20*a*, 20*b* have dual redundant connections to the pads 74 for the V+ and V− lines, although the number of connections could be increased or decreased if desired. Similar to FIG. 17, corner conductor 20*d* connects to the back contact 34 of the bottom right solar cell 14 (not shown), corner conductor 20*e* connects to the front contact 32 of the top right solar cell 14 (not shown), and corner conductor 20*f* connects to the back contact 34 of the top right solar cell 14 (not shown) through bypass diode 44*b*.

Other configurations of the PRM 30, and its connection to the substrate 12, can be found in U.S. Utility application Ser. No. 15/643,282, filed on same date herewith, by Eric Rehder, entitled "POWER ROUTING MODULE FOR A SOLAR ARRAY;" and U.S. Provisional Application Ser. No. 62/394,649, filed on Sep. 14, 2016, by Eric Rehder, entitled "POWER ROUTING MODULE FOR A SOLAR ARRAY," which are cross-referenced above.

Figure 19:
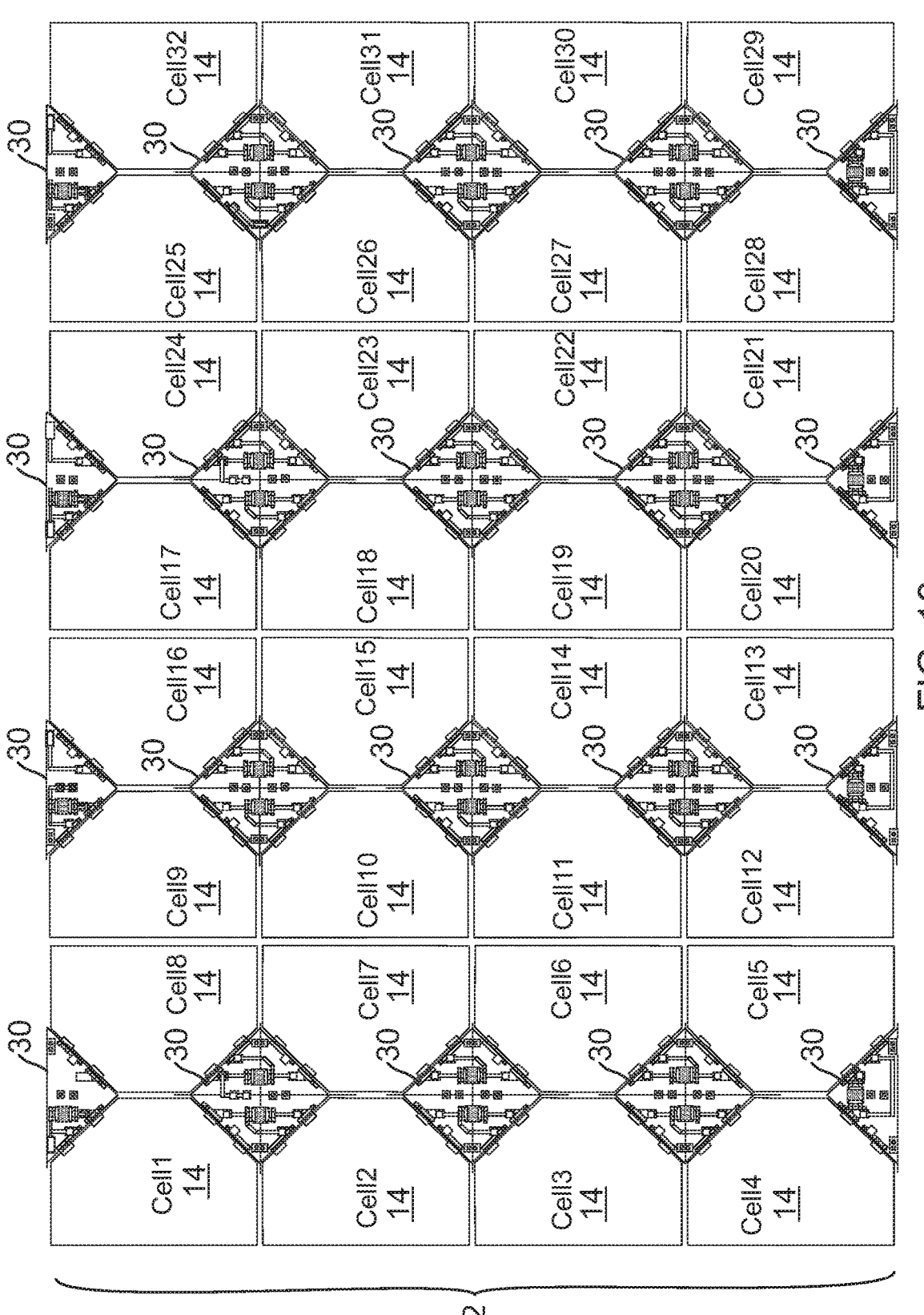
FIG. 19 shows the of an array of cells with the layout corresponding to the direction of the current as determined by the power routing modules.

FIG. 19 shows the layout for an array 22 comprised of four (4) rows by eight (8) columns of solar cells 14, labeled as Cell1 14 through Cell32 14, with the numbering of the solar cells 14 corresponding to the direction of the current as determined by the PRMs 30 electrically interconnecting the solar cells 14 within columns of the solar cells 14. Moreover, the PRMs 30 for the third/fourth, fifth/sixth, and seventh/eighth columns of the first row work in conjunction with the PRMs 30 in the first/second and fifth/sixth columns of the second row to terminate circuits between solar cells 14. The PRMs 30 in the fourth or bottom row bridge the current between the columns.

Other layouts for the array 22, using the PRM 30, also can be found in U.S. Utility application Ser. No. 15/643,282, filed on same date herewith, by Eric Rehder, entitled "POWER ROUTING MODULE FOR A SOLAR ARRAY;" and U.S. Provisional Application Ser. No. 62/394,649, filed on Sep. 14, 2016, by Eric Rehder, entitled "POWER ROUTING MODULE FOR A SOLAR ARRAY," which are cross-referenced above.

Power Routing Module with Switching Matrix

A solar cell array 22 with fixed corner conductors 20 on the substrate 12 can be fabricated, but the implementation of a static PRM 30 as described above offers significant flexibility and ease of design and manufacturing. Instead of using a static PRM 30 as described above, having fixed connections between different corner conductors 20, this disclosure describes how a PRM 30 with a switching matrix can make those connections. Locating the switching matrix in the PRM 30 enables the greatest amount of space to the switching matrix.

Specifically, this disclosure describes a PRM 30 with a switching matrix for dynamically selecting different conductor 20 layouts for different current paths. The use of the PRM 30 with the switching matrix overcomes failures in the solar cell array 22.

Currently, space-based solar cell arrays 22 are designed to produce more power than needed, because there are numerous concerns about failures that could reduce power. During operation in space, the solar cell array 22 is exposed to solar radiation, as well as other factors, that may cause the loss of one or more solar cells 14, due to degradation or damage. The reliability of the solar cell array 22 during operation, especially on orbit, remains problematic with the use of the static PRM 30 described above. For example, a failure of one solar cell 14 could remove the power of the entire circuit, which may involve 50 solar cells 14. Thus, the circuit works like a failure multiplier, wherein a failure of a single solar cell 14 appears as a failure of many solar cells 14. In another example, depending on distribution, 10 failed solar cells 14 could eliminate 10 circuits involving 500 solar cells 14. Conventional manufacturing results in these 10 solar cells 14 blocking the power production of another 490 healthy solar cells 14. This disclosure is based on recovering that power.

Presently, there is no way to control or otherwise route and/or reroute power due to the failure or degradation of cells 14. Instead, redundancy is built into a solar cell array 22 to ensure sufficient power can be provided to a vehicle or equipment in view of such failure or degradation. However, this causes extensive over-design of the solar cell array 22 to ensure operation, wherein solar cell arrays 22 are built with added solar cells 14 to account for possible losses.

The solution proposed herein eliminates the need to over-design the solar cell array 22. By including the switching matrix in the PRM 30, connections can be changed during operation. If a solar cell 14 fails, it is simply skipped, and all other solar cells 14 in the circuit can be utilized without penalty. This greatly improves reliability of power generation, especially in environments that put solar cells 14 at risk.

In one example, a method and system for switchably routing power in a solar cell array 22 comprises a PRM 30 with an addressable switching matrix having a plurality of pathways connected between the PRM 30 and a plurality of solar cells 14, wherein the addressable switching matrix is configured to route current (power) flow in response to a control signal. The connections made by the switching matrix would be changed during operation of the solar cell array 22. The series, stayout, termination configuration of each cell-to-cell connection would be changed as needed. Optionally, the control signal may be a wireless control signal from a remote source, eliminating the need for external wiring on the panel 10*a*.

The switching matrix can be implemented with electronic switches or mechanical relays, although mechanical relays are cumbersome and they tend to have higher power consumption than electronic switches. In either instance, the switching matrix can be powered by the vehicle's power system or alternatively directly from the solar cells 14 on the panel 10*a*. Key criteria are the ability to connect to a plurality of input and output paths, very low power consumption, and the ability to function in a space environment.

Figure 20:
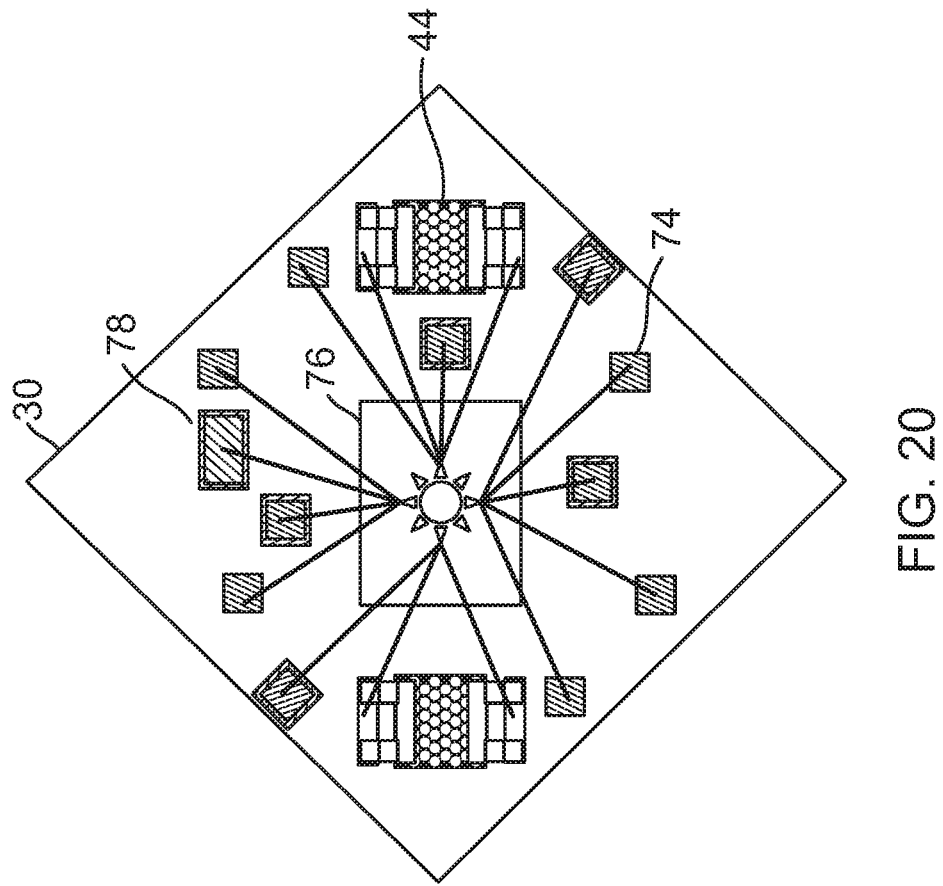
FIG. 20 shows an example of a power routing module, which is fabricated to include a switching matrix.

FIG. 20 shows an example of a PRM 30 with a switching matrix 76 for electrically interconnecting a plurality of solar cells 14 in an array 22, wherein the switching matrix 76 is configured for dynamically routing power among a plurality of current pathways connected between the PRM 30 and the plurality of solar cells 14 via pads 74, one or more bypass diodes 44, one or more power or bridging lines via pads 74, etc., as shown by the solid lines. A control signal is provided at pad 78 for the switching matrix 76, which may involve more than one conductor.

In one example, the switching matrix 76 is an electronic switching matrix 76 that comprises a space division circuit switch, in which the power on a selected input path is connected to a selected output path. However, the switching matrix 76 may be implemented by electromechanical electronic means.

The switching matrix 76 may be comprised of a crossbar switch with N×N cross-points, wherein N is the number of input paths and the number of output paths. By means of a control signal at each cross-point, which is a gate, the selected input path is connected to the selected output path.

The switching matrix 76 may be comprised of a multi-stage switch, which decreases the number of cross-points and hence complexity of the switch 76. Again, by means of a control signal at each stage, the selected input path is connected to the selected output path.

Figure 21:
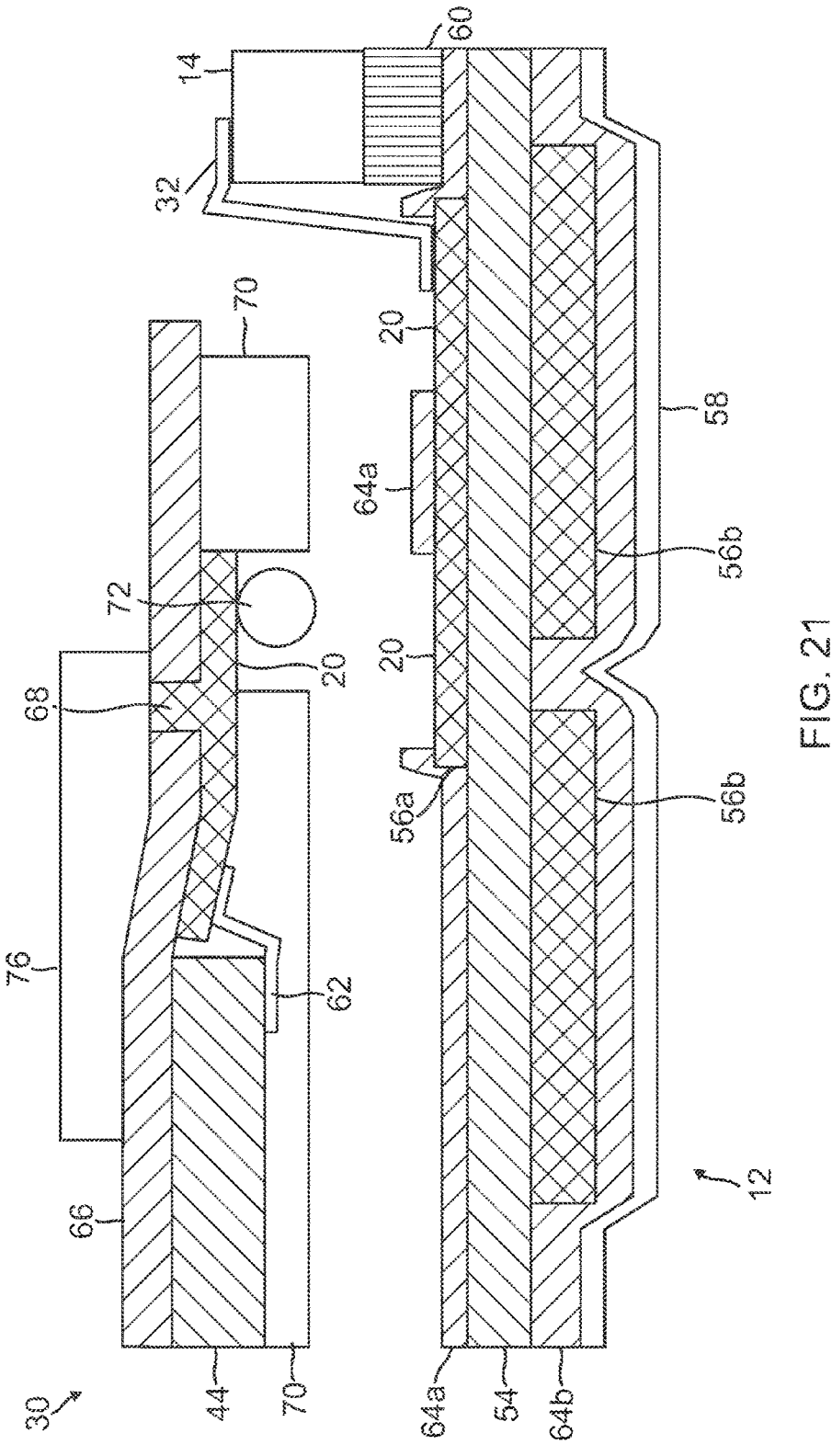
FIG. 21 is a schematic side view of an example with a substrate below and a power routing module with a switching matrix above, with the power routing module attached to the flex sheet with an adhesive.

FIG. 21 is a schematic side view similar to the example from FIG. 15, showing the PRM 30 with the switching matrix 76. In this example, the switching matrix 76 is attached on top of the polyimide layer 66 and is electrically connected to one or more of the corner conductors 20 of the PRM 30.

Figure 22:
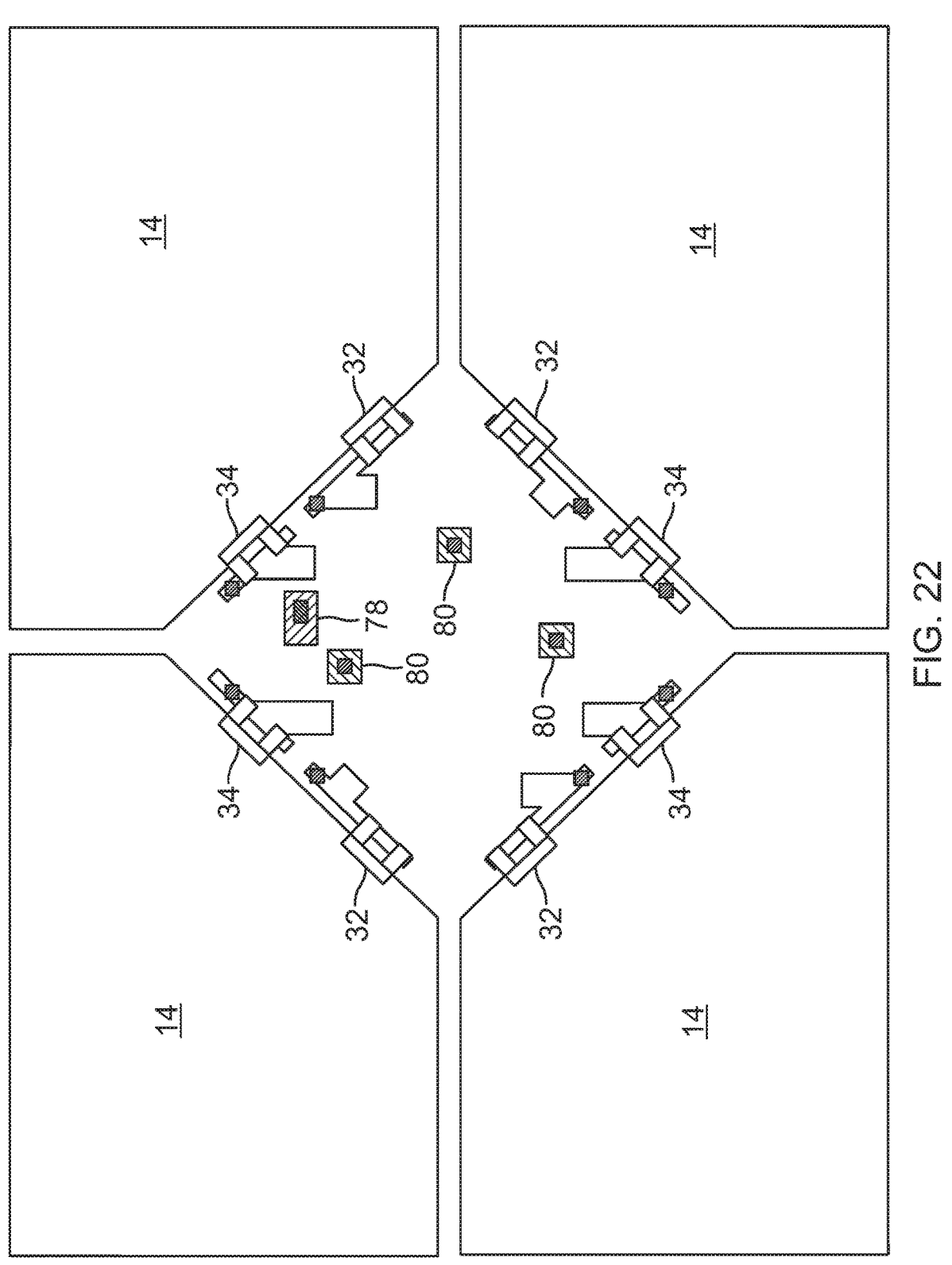
FIG. 22 shows a modification made to the conductors in the corner region to operate the switching matrix.

The PRM 30 with the switching matrix 76 is attached to the substrate 12 in the area 28 of the substrate 12 in the corner region 26 that remains exposed when the solar cells 14 are attached to the substrate 12. There are slight modifications to the conductors 20 in the corner region 26, as compared to the figures above, as shown in FIG. 22. For example, the pad 78 is used for one or multiple control signals and one or more conductors that operate the switching matrix 76. Also, pads 80 for V+ and V− line connections are repositioned slightly.

Figure 23:
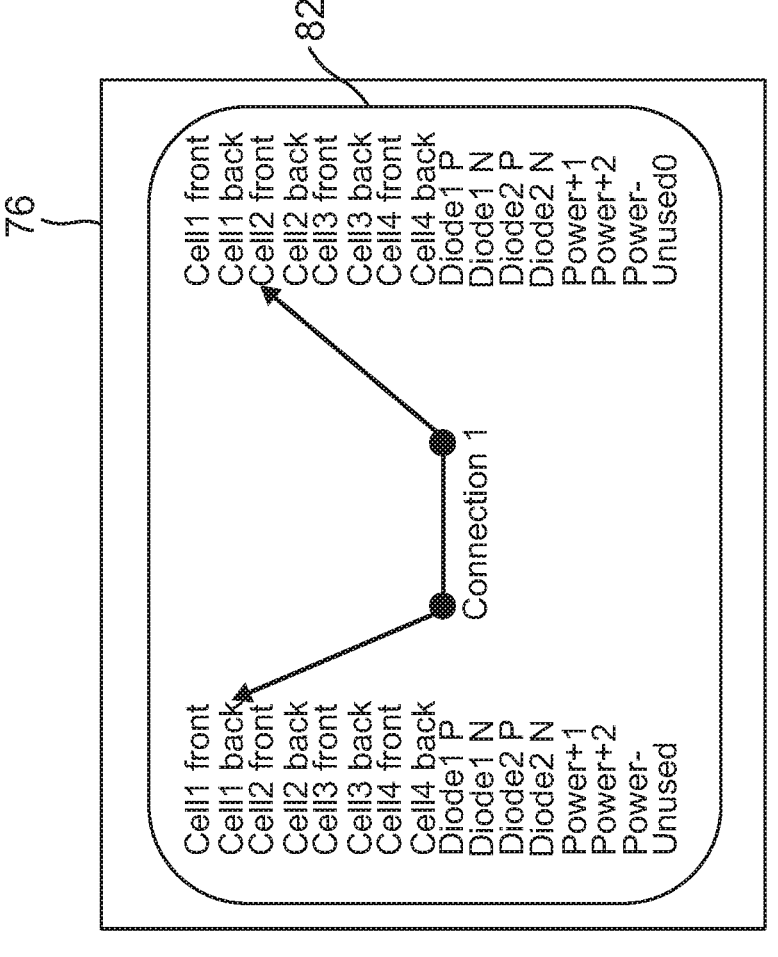
FIG. 23 illustrates one example of a switching matrix used with a power routing module.

FIG. 23 illustrates a single connection block 82 within the switching matrix 76, wherein the connection block 82 connects the selected input path on the left to the selected output path on the right.

The switching matrix 76 may be comprised of one or more connection blocks 82, each of which connects the selected input path to the selected output path according to the control signal. By means of the control signal at each connection block 82, the selected input path is connected to the selected output path.

In this example, for the single connection block 82 is labeled connection 1 and there are 16 input paths on the left capable of being connected to the 16 output paths on the right. Each of the paths is labeled, i.e., Cell1 front (32), Cell1 back (34), Cell2 front (32), Cell2 back (34), Cell3 front (32), Cell3 back (34), Cell4 front (32), Cell4 back (34), Diode1 N (n-side) (44), Diode1 P (p-side) (44), Diode2 N (n-side) (44), Diode2 P (p-side) (44), V+1, V+2, V−, and Unused. These assignments correspond to the connected pads 74 in FIG. 20. In the connection block 82 labeled as connection 1, the input path Cell1 back contact 34 is connected to the output path Cell2 front contact 32, which is a standard series configuration for current flow between solar cells 14.

The table below describes six connections made using the switching matrix 76 of the PRM 30 in a standard series configuration for current flow between four solar cells 14 aligned in the corner regions 26 of the substrate 12.

| | Input Path | Output Path |
|---|---|---|
| Connection 1 | Cell1 back (34) | Cell2 front (32) |
| Connection 2 | Cell1 back (34) | Diode1 P (44) |
| Connection 3 | Diode1 N (44) | Cell2 back (34) |
| Connection 4 | Cell4 back (34) | Cell3 front (32) |
| Connection 5 | Cell4 back (34) | Diode2 P (44) |
| Connection 6 | Diode2 N (44) | Cell3 back (34) |

In another example, the table below describes eight connections made using the switching matrix 76 of the PRM 30 in a standard series configuration for current flow between four solar cells 14 aligned in the corner regions 26, with some of the solar cells 14 terminated to the V+ and V− lines buried within the substrate 12 (e.g., in layer 56*b*).

| | Input Path | Output Path |
|---|---|---|
| Connection 1 | Cell1 back (34) | V + 1 |
| Connection 2 | V− | Cell2 front (32) |

-continued

| | Input Path | Output Path |
|---|---|---|
| Connection 3 | Cell2 front (32) | Diode1 P (44) |
| Connection 4 | Diode1 N (44) | Cell2 back (34) |
| Connection 5 | Cell4 back (34) | V + 2 |
| Connection 6 | V− | Cell3 front (32) |
| Connection 7 | Cell3 front (32) | Diode2 P (44) |
| Connection 8 | Diode2 N (44) | Cell3 back (34) |

In one example, a combination of static corner conductors 20, static PRMs 30, and PRMs 30 with switching matrices 76 may be used in the solar cell array 22, wherein the PRMs 30 with switching matrices 76 are distributed across the solar cell array 22 in some manner. In another example, only PRMs 30 with switching matrices 76 may be used in the solar cell array 22. Whereas FIG. 20 shows a switching matrix 76 that provides for full control of current routing, it will be sufficient in many situations to implement a smaller, simpler switch 76 with fewer configurations.

The solar cell array 22 could have multiple switching matrices 76. In order to control the switching matrices 76, each switching matrix 76 would need an identifier and an instruction to identify the switching configuration. Multiple switching matrices 76 may switch together, having the same switch configuration and thus may share an identifier. In either instance, it is necessary to uniquely address the switching matrix 76, each connection block 82 with the switching matrix 76, and the selected input and output paths within each connection block 82.

In one example, a 16 bit address is used to uniquely address the PRM 30 with the switching matrix 76. The 16 bit address can identify 65,536 distinct addresses, in an unsigned representation, with integer values between 0 and 65,535.

In one example, a 16 bit value is also used to uniquely address the selection of an input and output path combination within a connection pad 78 of the switching matrix 76, when there are 16 possible input paths and 16 possible output paths in the switching matrix 76. A total of 128 bits is required (16×8) to address all input and output path selections, when 8 connections blocks are used, as described in the table above.

In one example, the switching matrix 76 also requires 2 additional lines for power and a return value. If addressed as separate lines, this would require 16+128+2 lines or 146 lines. (Alternatively, power could be derived directly from the solar array 22.)

Clearly, having 146 lines in parallel would be cumbersome. However, these lines carry little current or power and thus can be made very narrow. Flex circuit resolution is in the range of 2 mils, which means that 144 lines that are 2 mils wide each with 144 spaces between them works out to roughly ½ an inch, all on pad 78. This is not impossible to achieve, but is cumbersome.

It is likely preferred that the information is transmitted in a serial pattern of bits. Using devices like a shift register, the serial data is communicated with a data line and a clock. The 144 data lines thus can be reduced to 2 lines, which would simplify layout and improve confidence.

An alternate addressing possibility is to use a wireless electromagnetic or optical control signal broadcast from a remote source, such as the satellite itself or a ground station via the satellite. This would further reduce complexity.

Fabrication

Examples of the disclosure may be described in the context of a method 84 of fabricating a solar cell 14, solar cell panel 10*a* and/or satellite, comprising steps 86-98, as shown in FIG. 24, wherein the resulting satellite 100 having a solar cell panel 10*a* comprised of solar cells 14 are shown in FIG. 25.

As illustrated in FIG. 23, during pre-production, exemplary method 84 may include specification and design 86 of the solar cell 14, solar cell panel 10*a* and/or satellite 100, and material procurement 88 for same. During production, component and subassembly manufacturing 90 and system integration 92 of the solar cell 14, solar cell panel 10*a* and/or satellite 100 takes place, which include fabricating the solar cell 14, solar cell panel 10*a* and/or satellite 100. Thereafter, the solar cell 14, solar cell panel 10*a* and/or satellite 100 may go through certification and delivery 94 in order to be placed in service 96. The solar cell 14, solar cell panel 10*a* and/or satellite 100 may also be scheduled for maintenance and service 98 (which includes modification, reconfiguration, refurbishment, and so on), before being launched.

Each of the processes of method 84 may be performed or carried out by a system integrator, a third party, and/or an operator (e.g., a customer). For the purposes of this description, a system integrator may include without limitation any number of solar cell, solar cell panel, satellite or spacecraft manufacturers and major-system subcontractors; a third party may include without limitation any number of venders, subcontractors, and suppliers; and an operator may be a satellite company, military entity, service organization, and so on.

As shown in FIG. 25, a satellite 100 fabricated by exemplary method 84 may include systems 102, a body 104, solar cell panels 10*a* comprised of solar cells 14, and one or more antennae 106. Examples of the systems 102 included with the satellite 100 include, but are not limited to, one or more of a propulsion system 108, an electrical system 110, a communications system 112, and a power system 114. Any number of other systems 102 also may be included.

FIG. 26 is an illustration of the solar cell panel 10*a* in the form of a functional block diagram, according to one example. The solar cell panel 10*a* is comprised of the solar cell array 22, which is comprised of one or more of the solar cells 14 individually attached to the substrate 12. Each of the solar cells 14 absorbs light 116 from a light source 118 and generates an electrical output 120 in response thereto.

At least one of the solar cells 14 has at least one cropped corner 24 that defines a corner region 26, such that an area 28 of the substrate 12 remains exposed when the solar cell 14 is attached to the substrate 12. When a plurality of solar cells 14 are attached to the substrate 12, the corner regions 26 of adjacent ones of the solar cells 14 are aligned, thereby exposing the area 28 of the substrate 12.

The area 28 of the substrate 12 that remains exposed includes one or more corner conductors 20 attached to, printed on, or integrated with the substrate 12, and one or more electrical connections between the solar cells 14 and the corner conductors 20 are made in a corner region 26. The corner region 26 may also include one or more bypass diodes 44.

The corner region 26 includes at least one contact, for example, a front contact 32 on a front side of the solar cell 14 and/or a back contact 34 on a back side of the solar cell 14.

A front contact 32 is used for making the electrical connections between the solar cell 14 and the corner conductors 20.

A power routing module 30 with a switching matrix 76 is attached to the exposed area 28 of the substrate 12 for dynamically selecting different conductor layouts for different current paths for electrically interconnecting solar cells 14 in the array 22.

The description of the examples set forth above has been presented for purposes of illustration and description, and is not intended to be exhaustive or limited to the examples described. Many alternatives, modifications and variations may be used in place of the specific elements described above.

What is claimed is:

1. A device for a solar cell array, comprising:

a plurality of solar cells each having at least one cropped corner in an array;

a power routing module for customizing electrical connections between the plurality of solar cells in the array, wherein the power routing module includes an electrically conductive layer comprised of one or more electrical conductors for electrically interconnecting the solar cells, and an insulation layer for electrically insulating the electrical conductors of the electrically conductive layer;

the power routing module and the solar cells are attached to a substrate, wherein the substrate is a multi-layer substrate comprised of one or more insulating layers separating and overlaying one or more patterned metal layers, and the patterned metal layers form a plurality of electrical conductors buried within the substrate; at least one corner region defined by cropped corners of the solar cells;

the power routing module is attached to the substrate in an area of the substrate in the corner region that remains exposed with the solar cells each having the at least one cropped corner resulting in the corner region;

wherein the area includes conducting pads in the substrate that provide connection points between the power routing module and conductive paths buried within the substrate;

wherein at least one of the conducting pads is located in the central region of the area in the corner region;

the electrical conductors of the power routing module electrically connect one or more contacts of the solar cells with the conducting pads on the substrate; and the power routing module includes a switching matrix for dynamically routing power among a plurality of current pathways connecting the power routing module and the plurality of solar cells and for changing electrical connections between the solar cells during operation.

2. The device of claim 1, wherein the switching matrix is configured for dynamically routing power among the plurality of current pathways connected between the power routing module and one or more bypass diodes.

3. The device of claim 1, wherein the switching matrix is configured for dynamically routing power among the plurality of current pathways connected between the power routing module and one or more V+, V−, or bridging lines.

4. The device of claim 1, wherein the switching matrix is configured for dynamically routing power in response to one or more control signals.

5. The device of claim 4, wherein the control signals are a wireless control signal from a remote source.

6. The device of claim 1, wherein the switching matrix is a space division circuit switch, in which the current on a selected input path is connected to a selected output path.

7. The device of claim 6, wherein the switching matrix is comprised of one or more connection blocks, each of which connects the selected input path to the selected output path according to a control signal.

8. The device of claim 1, wherein the switching matrix is uniquely addressed.

9. The device of claim 8, wherein each connection block within the switching matrix is uniquely addressed.

10. The device of claim 9, wherein selected input and output paths within each connection block are uniquely addressed.

11. A method, comprising:

fabricating a plurality of solar cells each having at least one cropped corner in an array;

fabricating a power routing module for customizing electrical connections between the plurality of solar cells in the array, wherein the power routing module includes an electrically conductive layer comprised of one or more electrical conductors for electrically interconnecting the solar cells, and an insulation layer for electrically insulating the electrical conductors of the electrically conductive layer;

the power routing module and the solar cells are attached to a substrate, wherein the substrate is a multi-layer substrate comprised of one or more insulating layers separating and overlaying one or more patterned metal layers, and the patterned metal layers form a plurality of electrical conductors buried within the substrate;

at least one corner region defined by cropped corners of the solar cells;

the power routing module is attached to the substrate in an area of the substrate in the corner region that remains exposed with the solar cells each having the at least one cropped corner resulting in the corner region;

wherein the area includes conducting pads in the substrate that provide connection points between the power routing module and conductive paths buried within the substrate;

wherein at least one of the conducting pads is located in the central region of the area in the corner region;

the electrical conductors of the power routing module electrically connect one or more contacts of the solar cells with the conducting pads on the substrate; and the power routing module includes a switching matrix for dynamically routing power among a plurality of current pathways connected between the power routing module and the plurality of solar cells and for changing electrical connections between the solar cells during operation.

12. The method of claim 11, wherein the switching matrix is configured for dynamically routing power among the plurality of current pathways connected between the power routing module and one or more bypass diodes.

13. The method of claim 11, wherein the switching matrix is configured for dynamically routing power among the plurality of current pathways connected between the power routing module and one or more power or bridging lines.

14. The method of claim 11, wherein the switching matrix is configured for dynamically routing power in response to a control signal.

15. The method of claim 14, wherein the control signal is a wireless control signal from a remote source.

16. The method of claim 11, wherein the switching matrix is a space division circuit switch, in which the power on a selected input path is connected to a selected output path.

17. The method of claim 16, wherein the switching matrix is comprised of one or more connection blocks, each of which connects the selected input path to the selected output path according to a control signal.

18. The method of claim 11, wherein the switching matrix is uniquely addressed.

19. The method of claim 18, wherein each connection block within the switching matrix is uniquely addressed.

20. The method of claim 19, wherein selected input and output paths within each connection block are uniquely addressed.

21. A solar cell panel, comprising:

a solar cell array comprised of at least one power routing module for customizing electrical connections between a plurality of solar cells in the array, wherein the power routing module includes an electrically conductive layer comprised of one or more electrical conductors for electrically interconnecting the solar cells, and an insulation layer for electrically insulating the electrical conductors of the electrically conductive layer;

the power routing module and the solar cells are attached to a substrate, wherein the substrate is a multi-layer substrate comprised of one or more insulating layers separating and overlaying one or more patterned metal layers, and the patterned metal layers form a plurality of electrical conductors buried within the substrate;

the solar cells each has at least one cropped corner, wherein at least one corner region is defined by cropped corners of the solar cells;

the power routing module is attached to the substrate in an area of the substrate in the corner region that remains exposed with the solar cells each having the at least one cropped corner resulting in the corner region;

wherein the area includes conducting pads in the substrate that provide connection points between the power routing module and conductive paths-buried within the substrate;

wherein at least one of the conducting pads is located in the central region of the area in the corner region;

the electrical conductors of the power routing module electrically connect one or more contacts of the solar cells with the conducting pads on the substrate; and the power routing module includes a switching matrix for dynamically routing power among a plurality of current pathways connected between the power routing module and the plurality of solar cells and for changing electrical connections between the solar cells during operation.

22. The solar cell panel of claim 21, wherein the switching matrix is configured for dynamically routing power among the plurality of current pathways connected between the power routing module and one or more bypass diodes.

23. The solar cell panel of claim 21, wherein the switching matrix is configured for dynamically routing power among the plurality of current pathways connected between the power routing module and one or more power or bridging lines.

24. The solar cell panel of claim 21, wherein the switching matrix is configured for dynamically routing power in response to a control signal.

25. The solar cell panel of claim 24, wherein the control signal is a wireless control signal from a remote source.

26. The solar cell panel of claim 21, wherein the switching matrix is a space division circuit switch, in which the power on a selected input path is connected to a selected output path.

27. The solar cell panel of claim 26, wherein the switching matrix is comprised of one or more connection blocks, each of which connects the selected input path to the selected output path according to a control signal.

28. The solar cell panel of claim 21, wherein the switching matrix is uniquely addressed.

29. The solar cell panel of claim 28, wherein each connection block within the switching matrix is uniquely addressed.

30. The solar cell panel of claim 29, wherein selected input and output paths within each connection block are uniquely addressed.

* * * * *